(12) United States Patent
Edwards

(10) Patent No.: US 11,876,134 B2
(45) Date of Patent: Jan. 16, 2024

(54) TRANSISTOR DEVICE WITH BUFFERED DRAIN

(71) Applicant: TEXAS INSTRUMENTS INCORPORATED, Dallas, TX (US)

(72) Inventor: Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/489,513

(22) Filed: Sep. 29, 2021

(65) Prior Publication Data

US 2023/0101691 A1    Mar. 30, 2023

(51) Int. Cl.
*H01L 29/78* (2006.01)
*H01L 29/10* (2006.01)
*H01L 29/08* (2006.01)
*H01L 29/66* (2006.01)

(52) U.S. Cl.
CPC ...... *H01L 29/7824* (2013.01); *H01L 29/0852* (2013.01); *H01L 29/1033* (2013.01); *H01L 29/66681* (2013.01)

(58) Field of Classification Search
CPC ............. H01L 29/0878; H01L 29/0653; H01L 29/1045

See application file for complete search history.

(56) References Cited

U.S. PATENT DOCUMENTS

| | | | | |
|---|---|---|---|---|
| 5,969,387 A | * | 10/1999 | Letavic | H01L 29/402 |
| | | | | 257/E29.279 |
| 9,583,612 B1 | * | 2/2017 | Edwards | H01L 21/324 |
| 2019/0148517 A1 | | 5/2019 | Edwards et al. | |
| 2020/0013890 A1 | | 1/2020 | Edwards et al. | |

FOREIGN PATENT DOCUMENTS

KR          20160055380 A  *  5/2016

* cited by examiner

*Primary Examiner* — Raj R Gupta
(74) *Attorney, Agent, or Firm* — Andrew R. Ralston; Frank D. Cimino

(57) ABSTRACT

A semiconductor device includes a source region. A drain region has a first conductivity type and a second dopant concentration spaced apart from the source region. A first drift region is located between the source region and the drain region and has the first conductivity type and a first dopant concentration that is lower than the second dopant concentration of the drain region. An oxide structure includes a first portion on or over the first drift region and a tapered portion between the first portion and the drain region. A substrate surface extension is between the tapered portion and the drain region. A buffer region has the first conductivity type between the first drift region and the drain region and under the tapered portion of the oxide structure. The buffer region has a third dopant concentration between the second dopant concentration and the first dopant concentration.

20 Claims, 14 Drawing Sheets

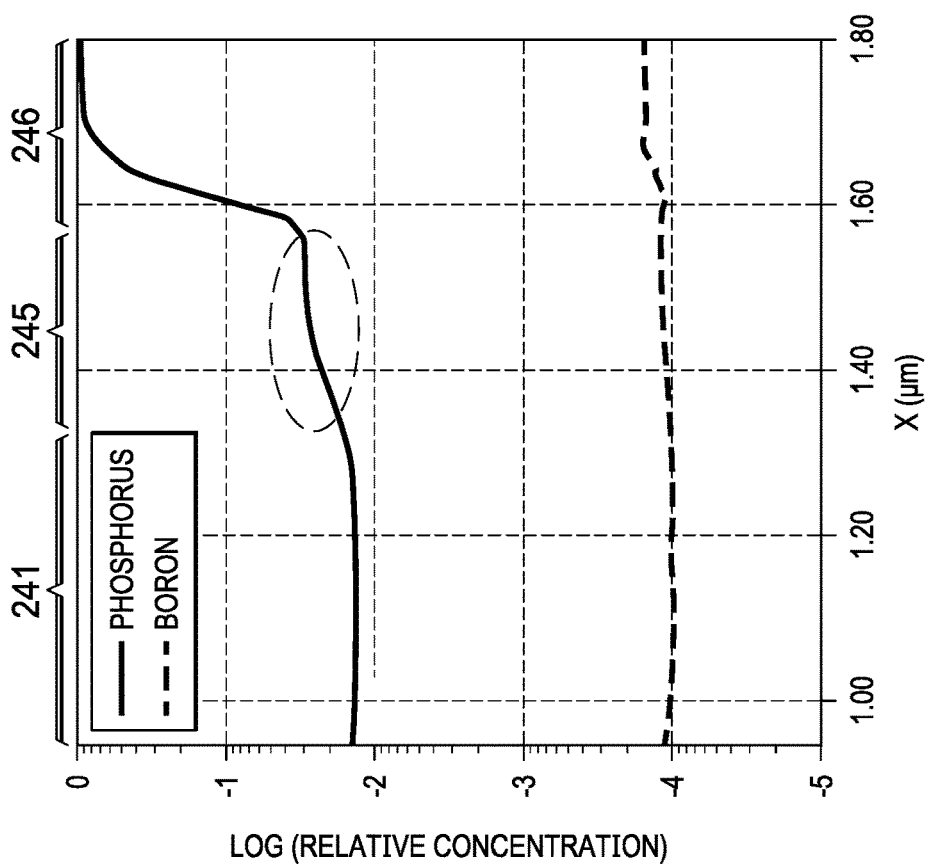
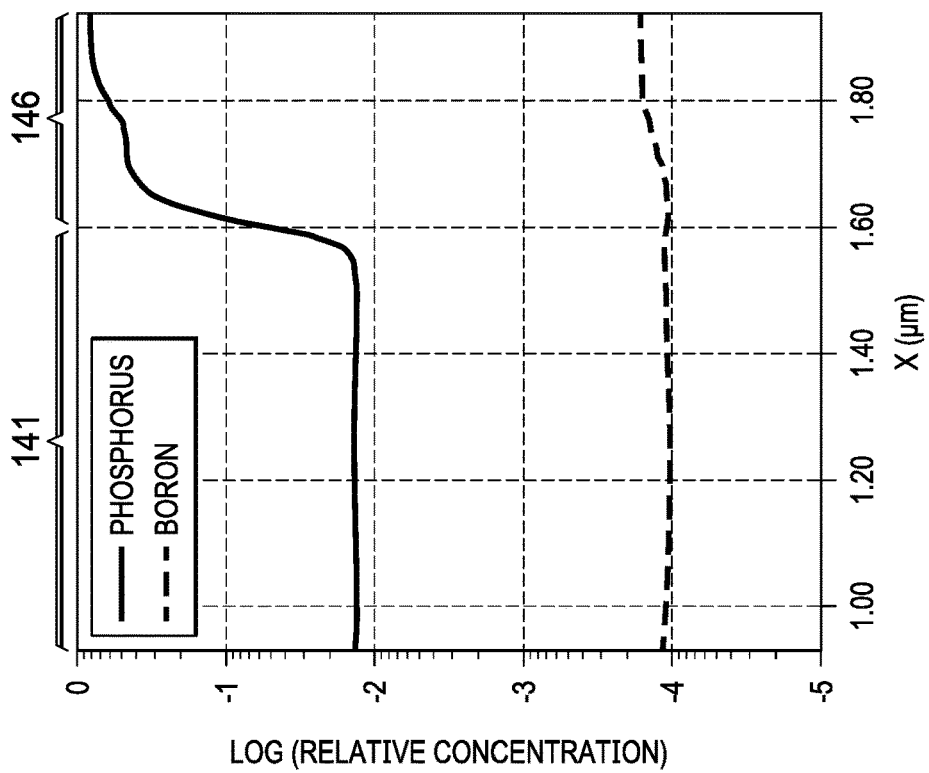

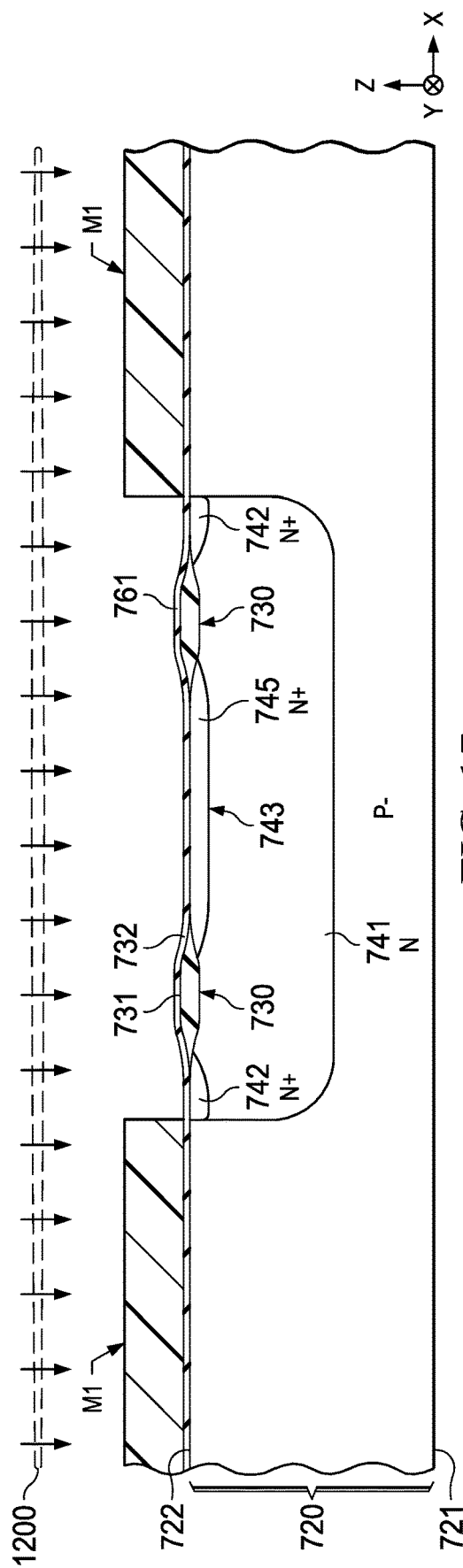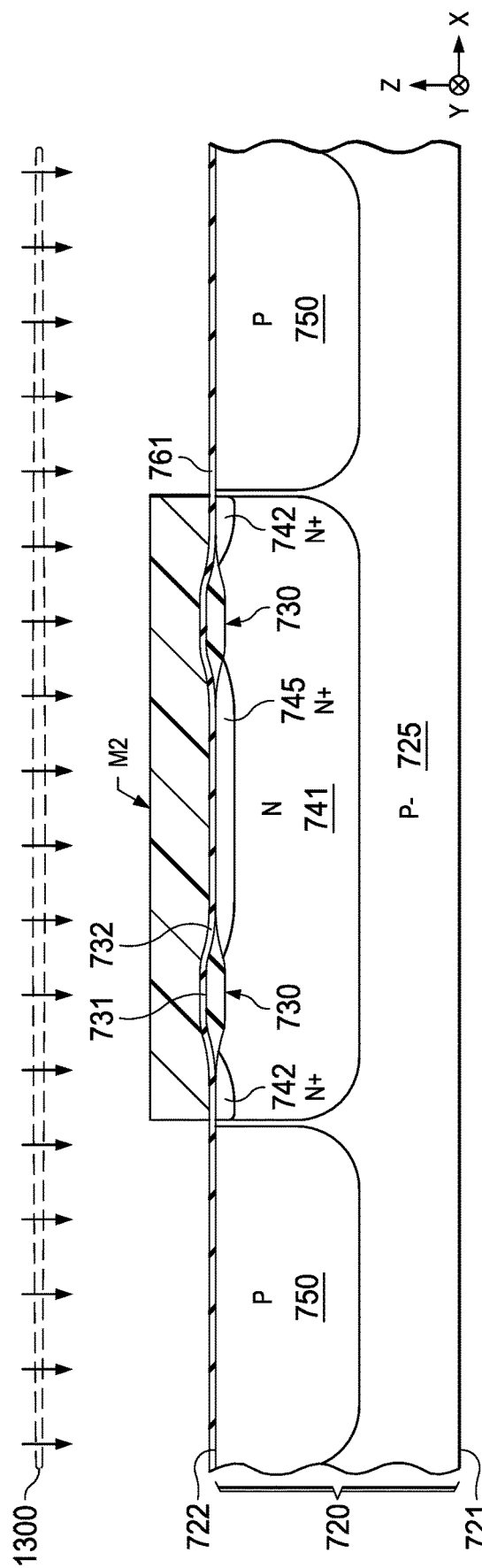

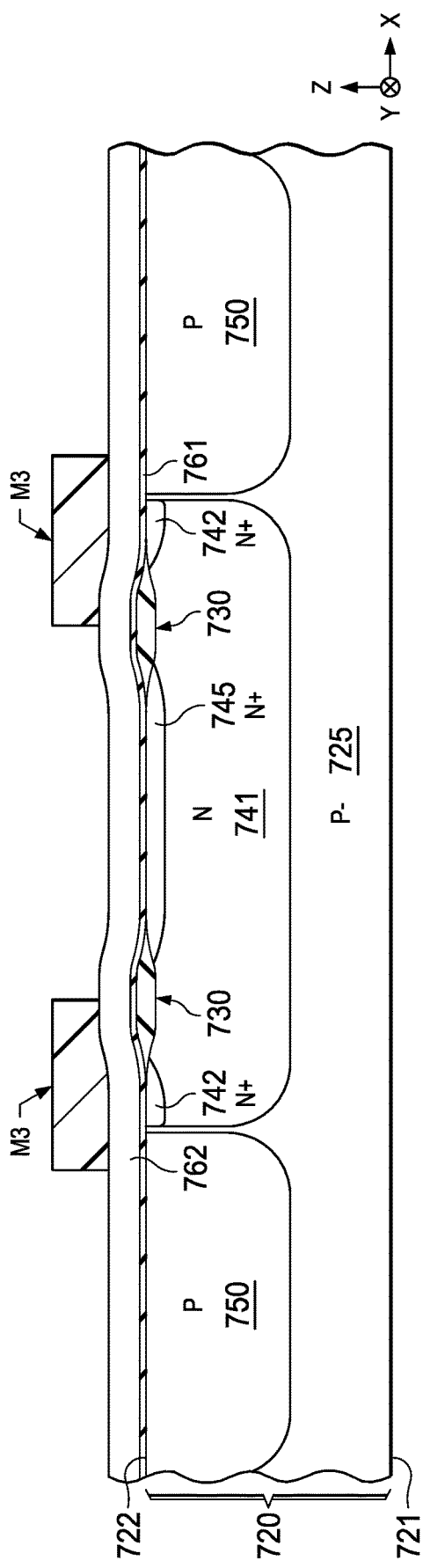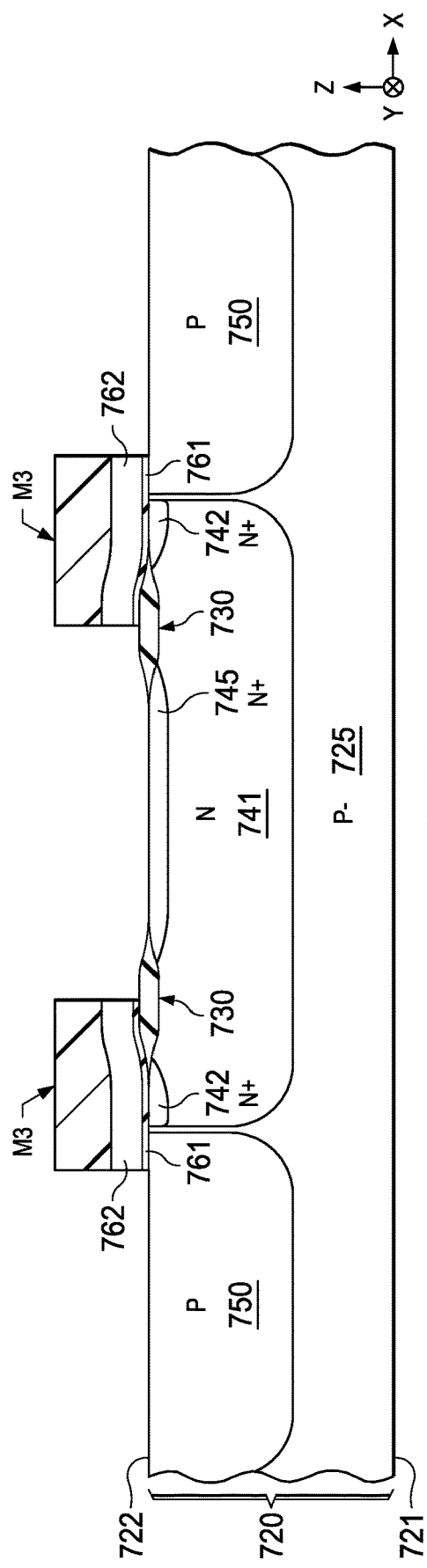

TRANSISTOR DEVICE WITH BUFFERED DRAIN

BACKGROUND

Semiconductor devices, such as silicon devices, have a wide range of applications. For examples, laterally diffused metal oxide semiconductor (LDMOS), or drain extended power transistors, are used in many applications such as switching direct-current (DC)-DC converters and other applications.

SUMMARY

Various disclosed methods and devices of the present disclosure may be beneficially applied to switching DC-DC converters and other applications where ruggedness is required to enable device survival during load transients, short currents, negative current flow, and other exceptional conditions. While such embodiments may be expected to provide improvements in performance, such as improved safe-operating-area (SOA) and ruggedness while having preserved or even reduced specific on-resistance, no particular result is a requirement of the present invention unless explicitly recited in a particular claim.

In one aspect of the present disclosure, a semiconductor device includes a source region in a semiconductor substrate. A drain region has a first conductivity type and a second dopant concentration spaced apart from the source region. A first drift region is located between the source region and the drain region and has the first conductivity type and a first dopant concentration that is lower than the second dopant concentration of the drain region. A channel region has a different second conductivity type between the source region and the first drift region. An oxide structure is between the channel region and the drain region and includes a first portion on or over the first drift region and a tapered portion between the first portion and the drain region. A substrate surface extension is between the tapered portion and the drain region. A gate structure is on or over the oxide structure and includes a portion over the channel region. A buffer region has the first conductivity type between the first drift region and the drain region and under the tapered portion of the oxide structure. The buffer region has a third dopant concentration between the second dopant concentration of the drain region and the first dopant concentration of the first drift region.

In another aspect of the present disclosure, a semiconductor device includes an n-type source region in a semiconductor substrate. An n-type drain region has a first dopant concentration spaced apart from the source region. An n-type drift region is located between the source region and the drain region and has a second dopant concentration that is lower than the first dopant concentration. A p-type channel region is between the source region and the drift region. A LOCOS structure is between the channel region and the drain region including a first portion on or over the drift region and a tapered portion between the first portion and the drain region. A substrate surface extension is between the tapered portion and the n-type drain region. A gate structure is on or over the oxide structure and including a portion over the channel region. A buffer region is between the drift region and the drain region and under the tapered portion of the oxide structure. The buffer region has a dopant concentration that increases no more than 10× from the drift region towards the drain region.

In another aspect, a method of forming a semiconductor device includes forming a local-oxidation-of-silicon (LOCOS) structure. The LOCOS structure includes a first portion and a tapered portion. A drift region having a first dopant concentration is formed by using a first implantation though an opening in a patterned resist layer. A buffer region and a drift transition region are formed simultaneously by using a second implantation through the opening in the patterned resist layer. The second implantation has a lower implantation energy than the first implantation, and dopants of second implantation penetrate through the tapered portion to form the buffer region. A gate structure is formed on or over the channel region. A source region is formed. A drain region having a second dopant concentration that is higher than the first dopant concentration of the drift region is formed. A third dopant concentration of the buffer region is between the first dopant concentration of the drift region and the second dopant concentration of the drain region. The tapered portion is between the first portion of the LOCOS structure and the drain region.

BRIEF DESCRIPTION OF THE DRAWINGS

For a detailed description of various examples, reference will now be made to the accompanying drawings in which:

FIG. 5 illustrates dopant concentrations along a direction from a drift region to a drain region of the baseline semiconductor device of FIG. 1;

FIG. 6 illustrates dopant concentrations along a direction from a drift region to a drain region of the example semiconductor device of FIG. 2;

FIGS. 13 to 22 illustrate cross-sectional views of example structures of various stages of the formation of the example semiconductor device of FIG. 7.

DETAILED DESCRIPTION

Laterally diffused metal oxide semiconductor (LDMOS) or drain extended power transistors are used in switching DC-DC converters and other applications where ruggedness is required to enable device survival during load transients, short currents, negative current flow, and other exceptional conditions. Further, a low specific on-resistance (Rsp) needs be maintained to minimize cost, since Rsp dictates die size at a given drain-source on resistance (Rds-on). For advanced low-Rsp LDMOS or drain extended transistor architectures, it frequently is difficult to maintain good ruggedness, e.g., device survival during transient events in which the drain undergoes avalanche breakdown.

The present disclosure is directed to semiconductor devices (e.g., LDMOS or drain extended transistor devices) with improved safe-operating-area (SOA) and ruggedness while having preserved or even reduced specific on-resistance. Such semiconductor devices may be beneficially employed in switching DC-DC converters and other applications where ruggedness is required to enable device survival during load transients, short currents, negative current flow, and other exceptional conditions. While such embodiments may be expected to provide improvements relative to conventional LDMOS or drain extended transistor devices, no particular result is a requirement of the present invention unless explicitly recited in a particular claim.

The described examples include a semiconductor device having a first drift region, a drain region, and a local-oxidation-of-silicon (LOCOS) structure including a main portion and a tapered portion (sometimes referred to as "bird's beak") that tapers down and is preserved between the main portion and drain region. The preserved tapered portion can serve as a screening oxide portion to allow dopants of shallow implantation (e.g., low-energy implantation) to penetrate therethrough to form a buffer region between the first drift region and the drain region, and accordingly to form a smooth doping-concentration transition from the lightly doped first drift region to the heavily doped drain region.

Figure 1:
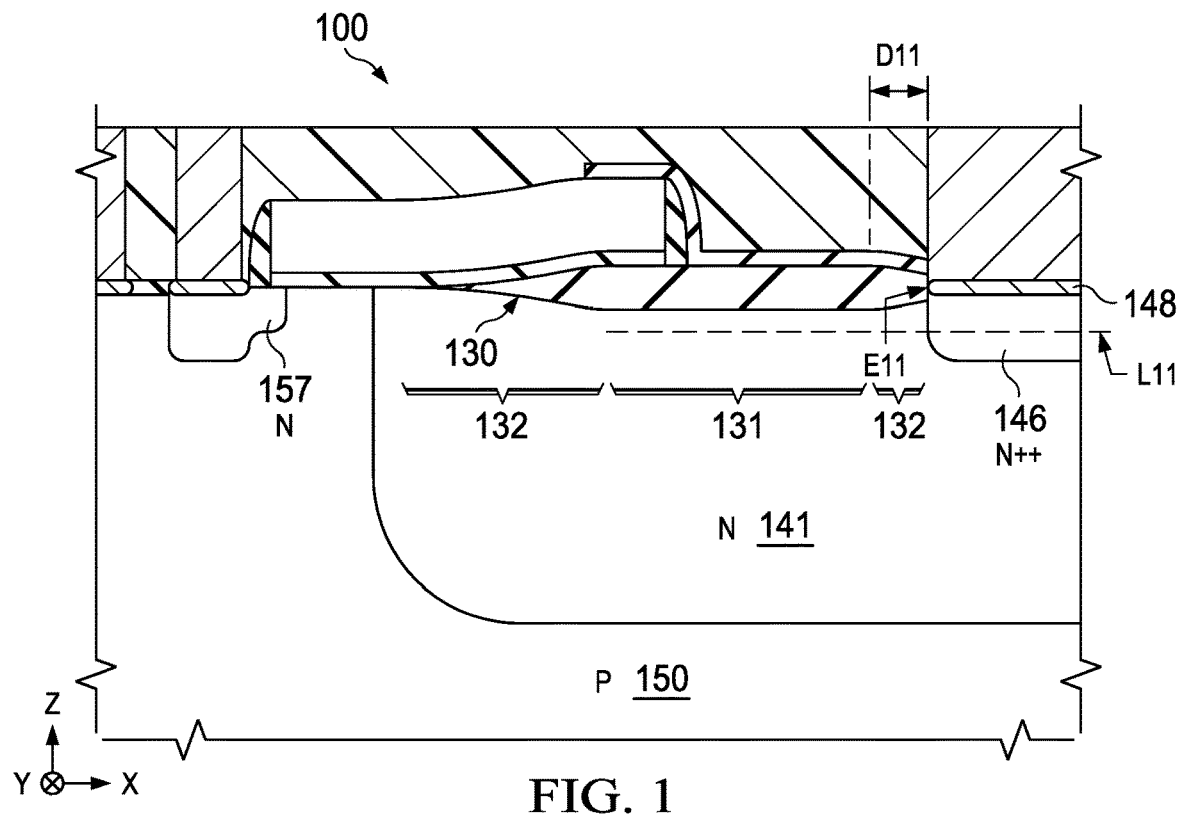
FIG. 1 illustrates a portion of a baseline semiconductor device.
Figure 2:
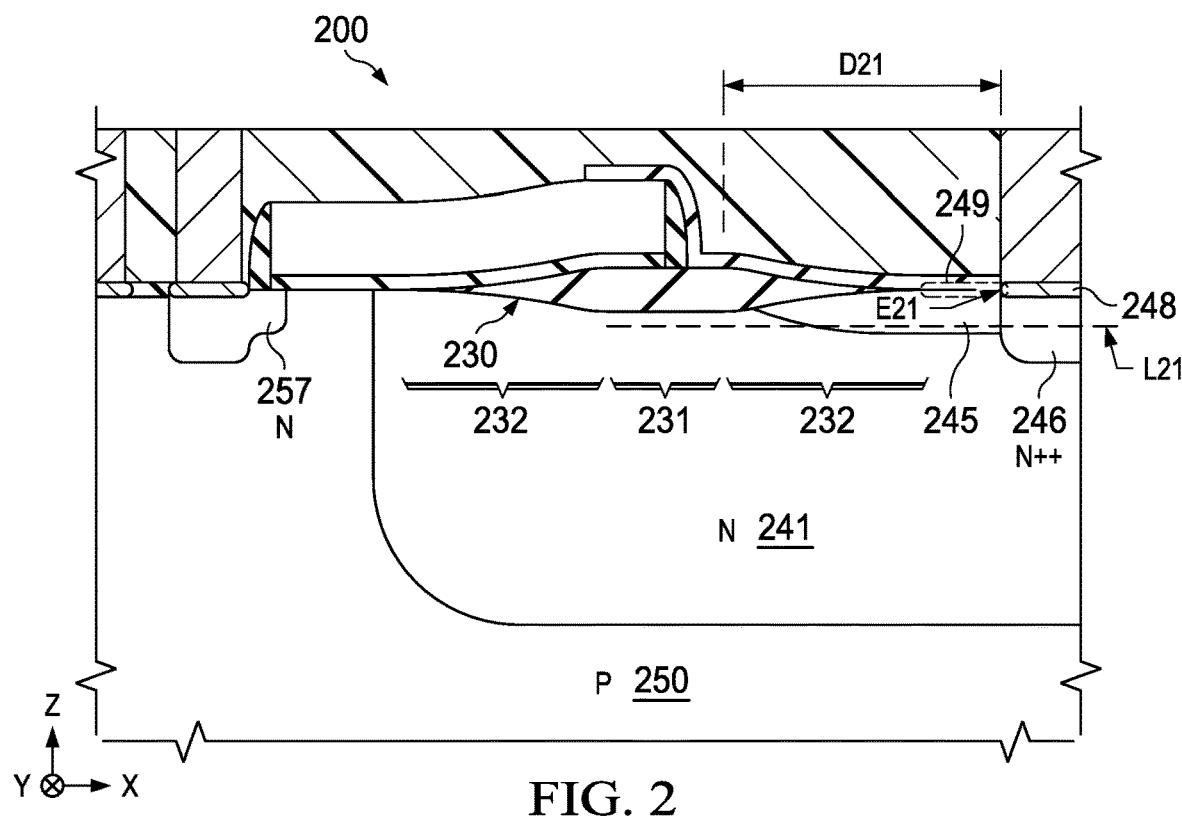
FIG. 2 illustrates a portion of an example semiconductor device of the disclosure.

FIG. 1 illustrates a portion of a baseline semiconductor device 100; and FIG. 2 illustrates a portion of an example semiconductor device 200 of the disclosure. The baseline semiconductor device 100 includes a drain region 146, a silicide contact 148 on or over the drain region 146, a first drift region 141, a body region 150, a source region 157, and a LOCOS structure 130. The example semiconductor device 200 includes a drain region 246, a silicide contact 248 on or over the drain region 246, a first drift region 241, a body region 250, a source region 257, a LOCOS structure 230, and a buffer region 245.

The LOCOS structure 130 includes a main portion 131 and a tapered portion 132 that tapers down. However, between the main portion 131 and drain region 146 of the baseline semiconductor device 100 or between the main portion 131 and the silicide contact 148, there is negligible or short tapered portion 132 or there may be no tapered portion. This is because the tapered portion overlapping with the silicide contact 148 may be etched away during formation of the baseline semiconductor device 100. In contrast, in the semiconductor device 200 (e.g., LDMOS device or drain extended transistor) of the present disclosure, by increasing the distance between a LOCOS structure 230 and a respective edge E21 of the silicide contact 248, a tapered portion 232 is preserved between the main portion 231 of the LOCOS structure 230 and the drain region 246 (or between the main portion 231 of the LOCOS structure 230 and the silicide contact 248). As shown in FIGS. 1 and 2, a distance D21 between the main portion 231 of the LOCOS structure 230 and an edge E21 of the silicide contact 248 is larger than a distance D11 between the main portion 131 of the LOCOS structure 130 and an edge E11 of the silicide contact 148.

In the example device 200, the tapered portion 232 preserved between the main portion 231 of the LOCOS structure 230 and the drain region 246 (or between the main portion 231 of the LOCOS structure 230 and the edge E21 of the silicide contact 248) can serve as a screening oxide portion to allow dopants of shallow implantation (e.g., relatively low-energy implantation) to penetrate therethrough to form a buffer region 245 between the first drift region 241 and the drain region 246, whereas no buffer region is formed between a first drift region 141 and the drain region 146 in the baseline device 100 due to no tapered portion or negligible or short tapered portion between the main portion 131 of the LOCOS structure 130 and the drain region 146. The example device 200 further includes a 'substrate surface extension' 249 (or a layer surface extension). As used herein a 'substrate surface extension' (e.g., 249) is defined as a portion of the substrate surface (or the layer surface) between the LOCOS structure (e.g., 230) and the drain region (e.g., 246) that is not covered by any portion of the LOCOS structure (e.g., 230), wherein the 'substrate' includes the portion of a semiconductor that is processed to include the components of the device 200, for example an epitaxial layer on a silicon wafer. The substrate surface extension 249 (together with the respective preserved tapered portion 232) can allow dopants of shallow implantation (e.g., relatively low-energy implantation) to penetrate therethrough to form a buffer region between the first drift region 241 and the drain region 246.

The implantation energy of the shallow implantation (e.g., relatively low-energy implantation) can be chosen such that the main portion 231 of the LOCOS structure 230 can block dopants of shallow implantation (e.g., relatively low-energy implantation), but the tapered portion 232 can allow dopants of shallow implantation (e.g., relatively low-energy implantation) to penetrate therethrough, where the shallow implantation is shallow with respect to a deep (or deeper) implantation for forming the first drift region 241.

In some examples, the main portion 231 of the LOCOS structure 230 has a thickness of 30 nm to 200 nm, and the implantation energy of the shallow implantation (e.g., relatively low-energy implantation) is less than 50 keV for phosphorus dopants and is less than 100 keV for arsenic dopants and is less than 200 keV for antimony dopants. The implantation energy of the shallow implantation (e.g., relatively low-energy implantation) can be chosen according to the thickness of the main portion 231 of the LOCOS structure 230. For example, with a larger thickness of the main portion 231 of the LOCOS structure 230, the implantation energy of the shallow implantation can be increased.

In the semiconductor device 200 (e.g., LDMOS device or drain extended transistor) of the present disclosure, via increasing the distance between the LOCOS structure 230 and the edge E21 of the silicide contact 248 and preserving the tapered portion 232 between the main portion 231 of the LOCOS structure 230 and the drain region 246, the buffer region 245 between the first drift region 241 and the drain region 246 having a doping profile that improves safe-operating-area (SOA) and ruggedness can be formed with no additional photoresist mask or implantation, and accordingly, fabrication cost can be reduced.

Figure 3A:
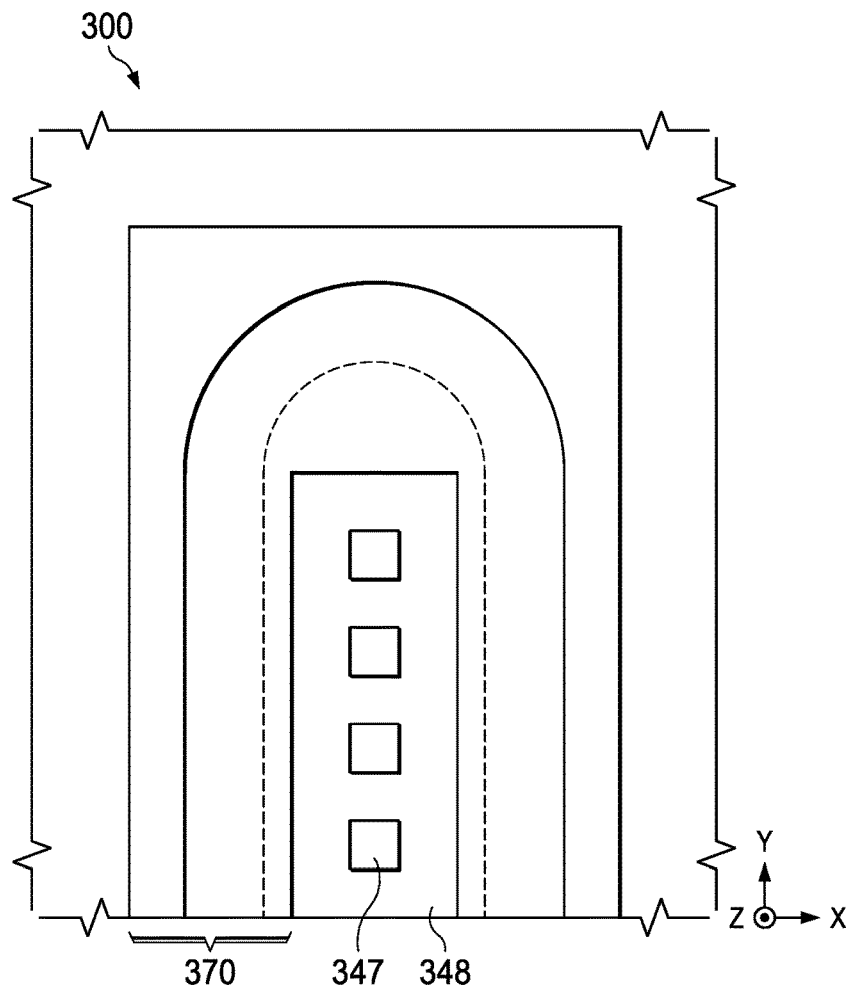
FIG. 3A illustrates a partial top view of a baseline semiconductor device.
Figure 3B:
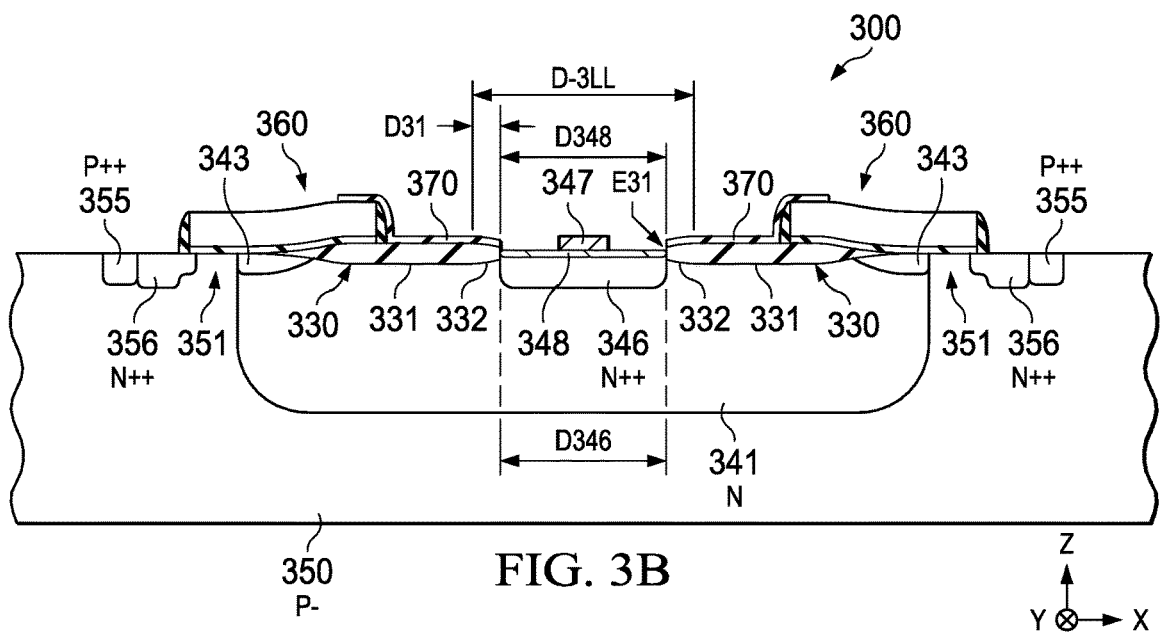
FIG. 3B illustrates a cross-sectional view of the baseline semiconductor device of FIG. 3A.

FIG. 3A illustrates a partial top view of a baseline semiconductor device 300; and FIG. 3B illustrates a cross-sectional view of the baseline semiconductor device 300 of FIG. 3A, including an LDMOS transistor. The baseline semiconductor device 300 includes a source region 356, a body region 350 that has a channel region 351, a drain region 346, a silicide contact 348 on or over the drain region 346, one or more tungsten contacts 347 on or over the silicide contact 348, a first drift region 341 between the drain region 346 and the channel region 351, and a body contact region 355. The semiconductor device 300 further includes a LOCOS structure 330 on or over the first drift region 341. The LOCOS structure 330 include a main portion 331. The LOCOS structure 330 can include a truncated tapered portion 332 between the main portion 331 and the drain region 346 that results from substantially removing the bird's beak of the LOCOS structure 330 on the drain side of the device, e.g. to reduce the Rds-on of the device. The device 300 also includes a doped region 343 under the bird's beak of the LOCOS structure 330 on the channel side. This feature is described more fully below. The baseline semiconductor device 300 further includes a gate structure 360 at least partially over or on the channel region 351, and a protection layer 370, such as a silicide block protection layer.

Figure 4A:
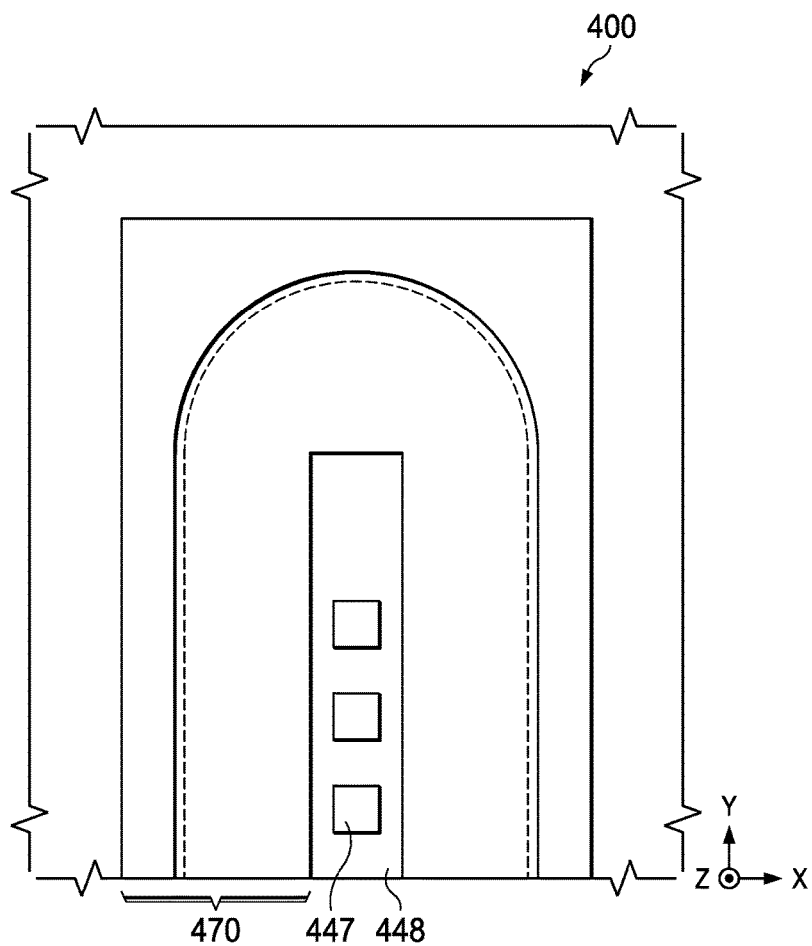
FIG. 4A illustrates a partial top view of another example semiconductor device.
Figure 4B:
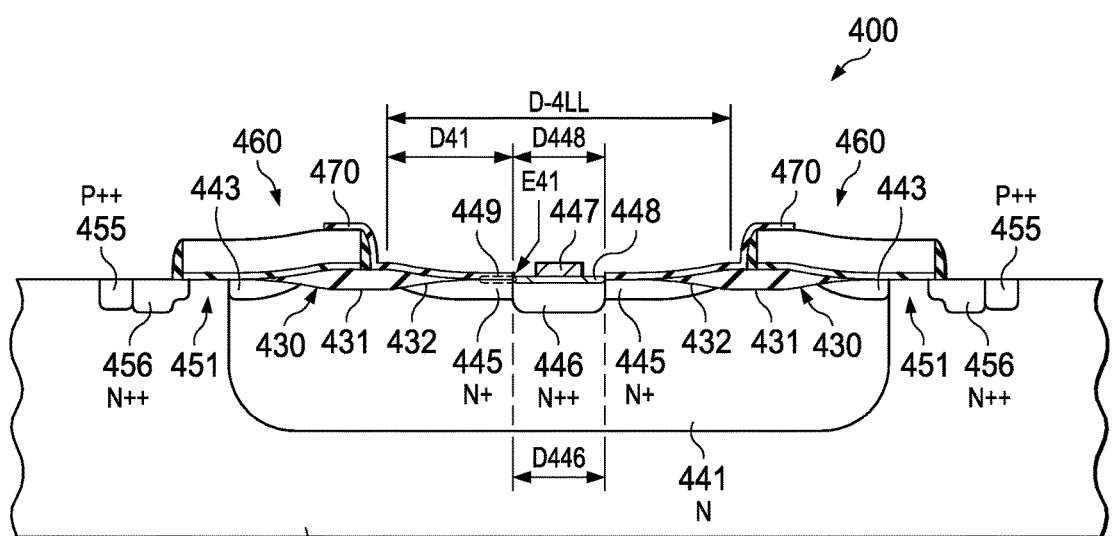
FIG. 4B illustrates a cross-sectional view of the semiconductor device of FIG. 4A

Referring now to FIGS. 4A and 4B, FIG. 4A illustrates a partial top view of example semiconductor device 400 of the disclosure, including an LDMOS transistor; and FIG. 4B illustrates a cross-sectional view of the semiconductor device 400 of FIG. 4A. The semiconductor device 400 includes a source region 456, a body region 450 that has a channel region 451, a body contact region 455, a drain region 446, and a first drift region 441 between the drain region 446 and the channel region 451. The semiconductor device 400 further includes a LOCOS structure 430 on or over a first drift region 441, a doped region 443 and a buffer region 445. The LOCOS structure 430 includes a main portion 431 and a tapered portion 432 between the main portion 431 and the drain region 446. Unlike the baseline device 300 the tapered portion 432 is not truncated, leaving essentially the full length of the LOCOS birds' beak and increasing the channel-to-drain spacing. The semiconductor device 400 further includes a gate structure 460 at least partially over or on the channel region 451, and a protection layer 470, such as a silicide block protection layer that mitigates or prevents silicidation of the LOCOS structure 430 and the buffer region 445 during deglazing and other operations, and prevents shorting the gate to the drain.

Figure 13:
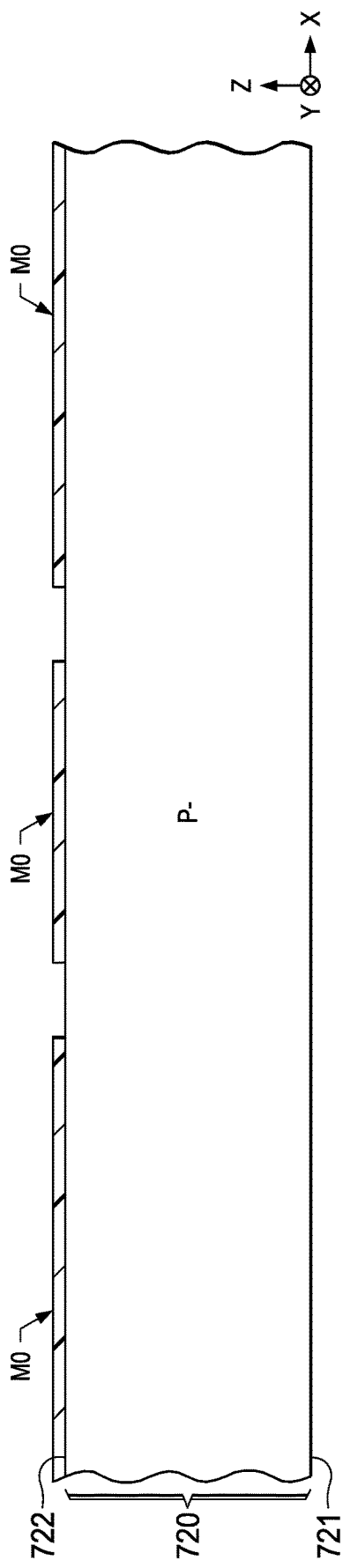
Figure 14:
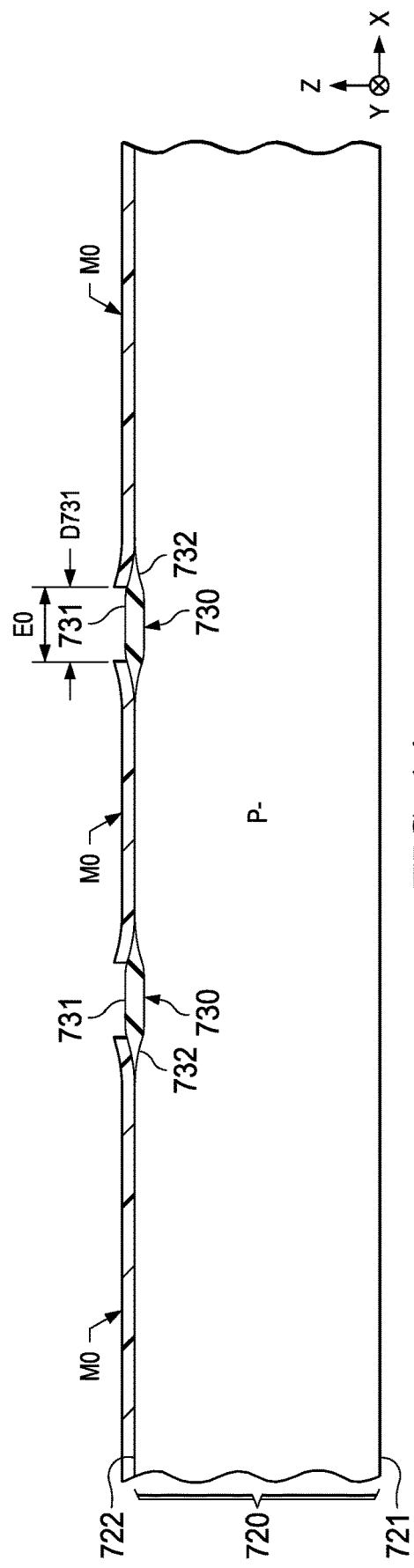

The main portion 431 of one or more respective LOCOS structures 430 of FIG. 4B corresponds to a respective opening of patterned mask used during a LOCOS process (also see FIGS. 13 and 14). For example, the width of main portion 431 along the marked X axis corresponds to the width of respective opening of patterned mask. Further, during the LOCOS process, diffusion of oxygen can occur between the underlying semiconductor layer and the overlying mask, and accordingly the tapered portion 432 (i.e., bird's beak) is formed and extends beyond the width of respective opening of patterned mask. A LOCOS-to-LOCOS (LTL) distance D-4LL of the device 400 is increased as compared to a LOCOS-to-LOCOS distance D-3LL of the baseline device 300. The LOCOS-to-LOCOS distance (e.g., D-4LL or D-3LL) is a distance between main portions (e.g., 431, 331) of one or more respective LOCOS structures (e.g., 430, 330). For example, main portions 431 of one or more respective LOCOS structures 430 in the device 400 are arranged farther apart, as compared to main portions 331 of one or more respective LOCOS structures 330 in the baseline device 300. Further, a width D446 of the drain region 446 of the device 400 can be reduced, as compared to a width D346 of the drain region 346; and a width D448 of the silicide contact 448 of the device 400 can be reduced, as compared to a width D348 of the silicide contact 348. With the increased LTL distance D-4LL and the decreased width D448 of the silicide contact 448 of the device 400, a distance D41 between the main portion 431 of the LOCOS structure 430 and an edge E41 of the silicide contact 448 is increased, as compared to a distance D31 between the main portion 331 of the LOCOS structure 330 and an edge E31 of the silicide contact 348 of the baseline device 300.

Further, with the increased distance D41 between the main portion 431 of the LOCOS structure 430 and the edge E41 of the silicide contact 448, a tapered portion 432 is preserved between the main portion 431 of the LOCOS structure 430 and the drain region 446. The preserved tapered portion 432 can serve as a screening oxide portion to allow dopants of shallow implantation (e.g., low-energy implantation) to penetrate therethrough to form a smooth doping-concentration transition from the first drift region 441 (e.g., under the gate structure 460 and under the main portion 431) to the heavily doped drain region 446 (see, e.g., FIG. 6). In contrast, the baseline device (e.g., 100, 300) has an abrupt doping-concentration transition with high electric-field (see, e.g., FIG. 5).

The preserved tapered portion 432 can serve as a screening oxide portion to allow dopants of shallow implantation (e.g., low-energy implantation) to penetrate therethrough to form a buffer region 445 between the first drift region 441 and the drain region 446. The example device 400 further includes a 'substrate surface extension' 449 (or a layer surface extension). The substrate surface extension 449 is defined as a portion of the substrate surface (or the layer surface) between the LOCOS structure 430 and the drain region 446 that is not covered by any portion of the LOCOS structure 430. The substrate surface extension 449 (and the respective and adjacent preserved tapered portion 432) can allow dopants of shallow implantation (e.g., low-energy implantation) to penetrate therethrough to form a buffer region 445 between the first drift region 441 and the drain region 446. Because of gradually reduced thickness of the tapered portion 432 in the direction from the LOCOS structure 430 towards the drain region 446, the dopant concentration of the respective buffer region 445 increases gradually and smoothly (see, e.g., the ellipse region of FIG. 6). In contrast, in the baseline device 300, no buffer region is formed between the first drift region 341 and the drain region 346, because of negligible or short tapered portion or no tapered portion between the main portion 331 of the LOCOS structure 330 and the drain region 346. Accordingly, the baseline device (e.g., 100, 300) has an abrupt doping-concentration transition with high electric-field (see, e.g., FIG. 5).

The doped region 443 under the LOCOS structure 430 at the channel end (analogous to the doped region 343 of the baseline device 300) serves a very different role than the buffer region 445 and therefore the buffer region 445 is an important and non-obvious improvement. The doped region 443 reduces Rds-on and the cost figure of merit RSP (which is Rds-on times the half-pitch of the LDMOS transistor). The portion of device 400 that is benefitted by the presence of the doped region 443 is sometimes referred to as the JFET region. The JFET region is the part of the drift region that connects the inversion layer of the channel region 451 under the gate structure 430 to the n-doped drift region 441 under the LOCOS structure 430. The extra n-type doping provided by the doped region 443 provides electrostatic screening to alleviate damage that could be otherwise caused by hot carrier injection from the channel region 451 to the drift region 441. This is because in implementations in which the device 400 is operated at high voltage, an early sign of device aging under hot carrier stress is an increase in the drift region resistance. The increased doping of the doped region 443 "pushes out" the onset of this resistance increase, enabling improved device reliability.

In contrast, the extra doping provided by the buffer region 445 provides an unrelated role in improving the reliability of the device 400, or the "ruggedness" of the device. More specifically, under drain reverse bias, the n-type drift region doping depletes all the way through the region under the LOCOS structure 430, sometimes referred as the RESURF effect. However, when the depletion edge meets the extra n-type doping of the substrate surface extension 449, the doping is too strong to deplete, and avalanche occurs. This sets the breakdown voltage BVDSS of the device. Note that BVDSS is proportional to the distance of depletion, so it reflects the length of the LOCOS 431 but not the substrate surface extension 449. Under high injection conditions, the high field portion of the drift region can extend all the way to the drain region 446 This effectively increases the drift length during high injection. The breakdown under strong injection conditions is referred to as snapback, and it is generally destructive in such devices. If the gate voltage is greater than zero and some channel current is flowing, and the drain is taken into breakdown, this combines the effects of avalanching and current injection from the channel. A rugged LDMOS device is one whose snapback failure voltage is substantially higher than BVDSS, because this relationship guarantees that after the LDMOS undergoes BVDSS, it can survive avalanching for a range of voltages before undergoing destructive snapback failure. This avalanching behavior allows the LDMOS to protect itself somewhat against adverse high-power events such as capacitive electrostatic discharge, inductive load dump or flyback, etc. This presence of the buffer region 445 provides such improved ruggedness in a manner unrelated to any effect provided by the doped region 443, and thereby increase the SOA of the device.

FIG. 5 illustrates dopant concentrations along a direction from a first drift region to a drain region of the baseline semiconductor device (such as baseline device 100 of FIG. 1); and FIG. 6 illustrates dopant concentrations along a direction from a first drift region to a drain region of the example semiconductor device (such as example device 200 of FIG. 2). Referring to FIGS. 1 and 5, along +X direction from a first drift region to a drain region of the baseline semiconductor device 100 of FIG. 1, e.g., along the dashed line L11 in FIG. 1, the phosphorus dopant concentration is uniform in the first drift region 141 that is lightly doped at a first dopant concentration, and abruptly changes to a second dopant concentration in the heavily doped drain region 146. In one example, an abrupt change is an increase by greater than one order of magnitude over a lateral distance of 100 nm. In contrast, referring to FIGS. 2 and 6, along +X direction from a first drift region to a drain region of the semiconductor device 200 of FIG. 2, e.g., along the dashed line L21 in FIG. 2, the phosphorus dopant concentration increases from a first dopant concentration in a lightly-doped first drift region 241 to a gradually-increasing third dopant concentration (see the ellipse region) in the added buffer region 245 that is intermediately doped, before abruptly increasing to a second dopant concentration in the heavily doped drain region 246. The third dopant concentration introduced by the added buffer region 245 is higher than the first dopant concentration in the first drift region 241 and lower than the second dopant concentration in the heavily doped drain region 246, and smoothly and gradually increases. In various examples, a gradual change provides an increase of dopant concentration of at least 1.5 times and no more than 10 times in the buffer region 245 over a lateral distance of 300 nm. In some examples the increase of dopant concentration is in a range from about 2× to about 5×. In another example the dopant concentration increases at least 50% and no more than 400% over a distance of 300 nm within the buffer region 245. In the example of FIG. 6, for instance, the phosphorous concentration increases about 2× from a first concentration to the left of the ellipse to a second concentration within the ellipse within a distance of about 200 nm and remains at the second concentration for distance of about 100 nm before abruptly increasing. Accordingly, the doping-concentration transition from the first drift region to the drain region is smoother in the example device (such as the example semiconductor device 200 of FIG. 2) than in the baseline device (such as the baseline device 100 of FIG. 1). It is expected that the smoother transition of dopant concentration provided by the tapered portion 232 reduces the electrical field gradient between the drift region 241 and the drain 246, and that this reduced gradient will reduce impact ionization of charge carriers near the drain, thereby increasing the SOA.

Figure 7:
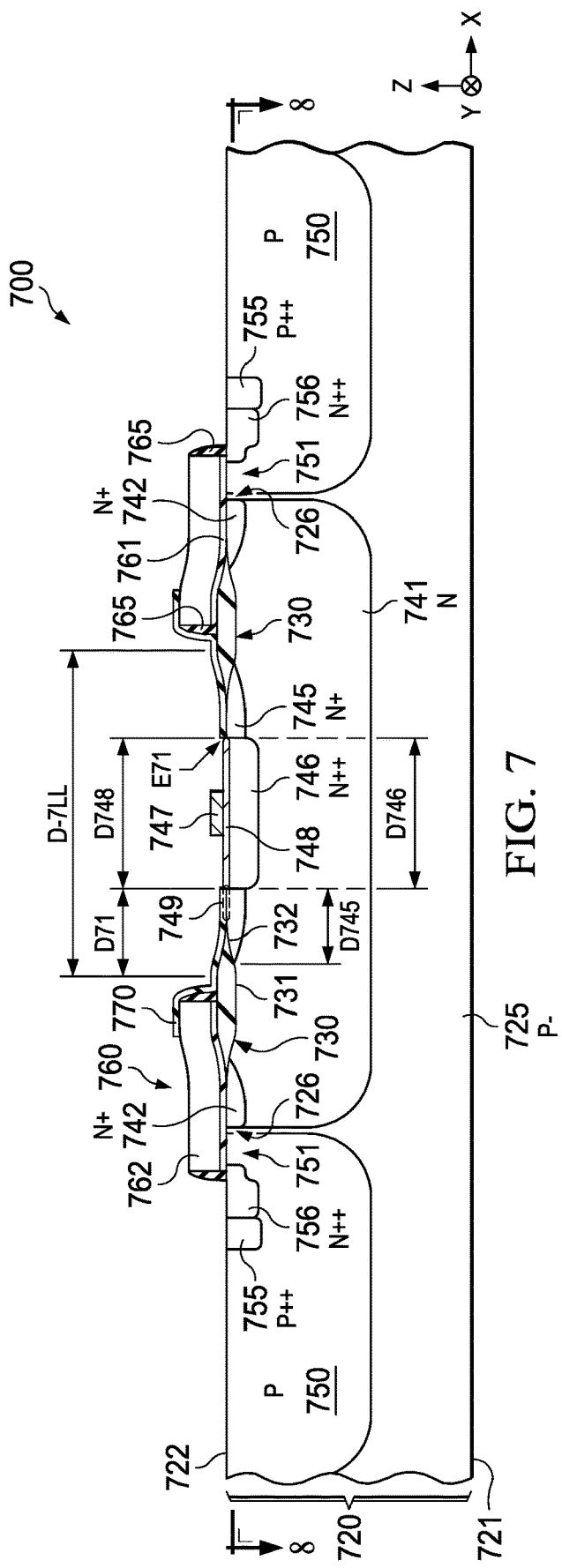
FIG. 7 illustrates a cross-sectional view of another example semiconductor device according to described examples.
Figure 8:
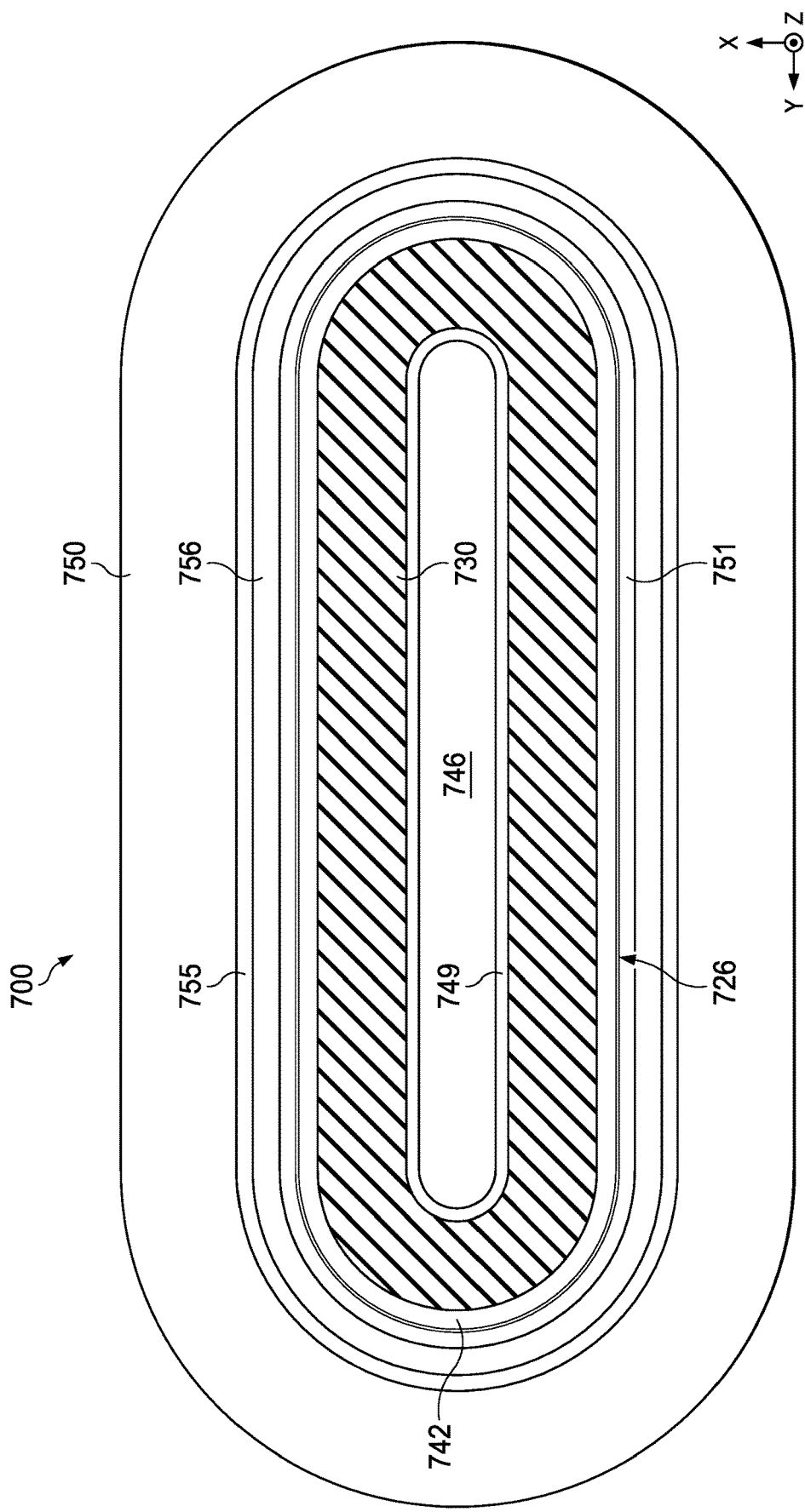
FIG. 8 illustrates another example cross-sectional view of the semiconductor device of FIG. 7.

FIG. 7 illustrates a cross-sectional view of another example semiconductor device 700 according to described examples. FIG. 8 illustrates another example cross-sectional view of the semiconductor device 700 at the level indicated in FIG. 7. The semiconductor device 700 (such as a LDMOS device or drain extended transistor) includes a semiconductor layer 720 that includes a semiconductor region 725, a first drift region 741 buried in the semiconductor layer 720, drift transition regions 742, LOCOS structures 730, buffer regions 745, a drain region 746, a silicide contact 748 on or over the drain region 746, tungsten contacts 747 on or over the silicide contact 748, body regions 750 that include channel regions 751, body contact regions 755 in contact with body regions 750, and source regions 756. The semiconductor device 700 further includes one or more gate structures 760 that each includes a gate dielectric layer 761 and a gate electrode 762, sidewall spacers 765, and SiBLK 770. The buffer region (such as 745) and the drift transition region (such as 742) can operate or serve as second drift regions. The second drift regions (such as the buffer region 745 and the drift transition region 742) and the first drift region (such as 741) can form or operate as a drift region that couples the channel region (such as 751) to the drain region (such as 746).

The semiconductor layer 720 has a first surface 721 and an opposing second surface 722. FIG. 7 also illustrates a coordinate system having X, Y, and Z axes. The X-axis and the Y-axis are orthogonal to each other and are parallel to a plane of the semiconductor layer 720, e.g., the first surface 721 of the semiconductor layer 720. The X and Y-axes are thus referred to as "in-plane direction." The Z-axis is perpendicular to the X and Y-axes and thus perpendicular to the plane of the semiconductor layer 720. Accordingly, the Z-axis is referred to as an "out-of-plane direction."

In some examples, a material of the semiconductor layer 720 includes doped silicon, such as p-type silicon, and is doped at P− dopant concentration, e.g. lightly doped. In other examples, a material of the semiconductor layer 720 may include silicon, germanium, gallium arsenide, and/or any other suitable semiconductor. A p-type semiconductor is a semiconductor for which the majority carriers are holes, and an n-type semiconductor is a semiconductor for which the majority carriers are electrons.

A dopant concentration of a p-type semiconductor may be a P dopant concentration in a range of $3 \times 10^{16}$ cm$^{-3}$ to $3 \times 10^{18}$ cm$^{-3}$, a P+ dopant concentration in a range of $1 \times 10^{19}$ cm$^{-3}$ to $1 \times 10^{22}$ cm$^{-3}$, or any other suitable p-type dopant concentration. A dopant concentration of an n-type semiconductor may be an N dopant concentration in a range of $3 \times 10^{15}$ cm$^{-3}$ to $1 \times 10^{18}$ cm$^{-3}$, an N+ dopant concentration that is approximately 2 to 10 times higher than an N dopant concentration, an N++ dopant concentration in a range of $1 \times 10^{19}$ cm$^{-3}$ to $1 \times 10^{22}$ cm$^{-3}$, or any other suitable n-type dopant concentration. Types of semiconductor can be n-type, p-type that is opposite to n-type, or undoped semiconductor.

The LOCOS structure 730 includes a main portion 731 and tapered portions 732 that taper down. The thickness of the tapered portion 732 between the main portion 731 and the drain region 746 is gradually reduced in a direction pointing from the first drift region 741 under the main portion 731 to the drain region 746. A LOCOS-to-LOCOS distance D-7LL of the device 700 is increased as compared to the LOCOS-to-LOCOS distance D-3LL of the baseline device 300. The LOCOS-to-LOCOS distance D-7LL is a distance between main portions 731 of LOCOS structures 730. The main portions 731 of LOCOS structures 730 in the device 700 are arranged farther apart, as compared to main portions 331 of LOCOS structures 330 in the baseline device 300. Further, a width D746 of the drain region 746 of the device 700 may be reduced, as compared to a width of the drain region in a baseline device (e.g., width D346 of the drain region 346 of baseline device 300); and a width D748 of the silicide contact 748 of the device 700 can be reduced, as compared to a width of silicide contact in a baseline device (e.g., a width D348 of the silicide contact 348 of the baseline device 300). the increased LOCOS-to-LOCOS distance D-7LL and/or the decreased width D748 of the silicide contact 748 in the example device 700, a distance D71 between the main portion 731 of the LOCOS structure 730 and an edge E71 of the silicide contact 748 is increased, as compared to, e.g., a distance D31 between the main portion 331 of the LOCOS structure 330 and the edge E31 of the silicide contact 348 of the baseline device 300.

In the present disclosure, with the increased distance D71 between the main portion 731 of the LOCOS structure 730 and the edge E71 of the silicide contact 748, a tapered portion 432 is preserved between the main portion 731 of the LOCOS structure 730 and the drain region 746. The preserved tapered portion 732 can serve as a screening oxide portion to allow dopants of shallow implantation (e.g., low-energy implantation) to penetrate therethrough to form a smooth doping-concentration transition from the first drift region 741 (e.g., under the gate structure 760 and under the main portion 731) to the heavily doped drain region 746. In contrast, the baseline device (e.g., 100, 300) has an abrupt doping-concentration transition with high electric-field.

The preserved tapered portion 732 can serve as a screening oxide portion to allow dopants of shallow implantation (e.g., low-energy implantation) to penetrate therethrough along −Z direction to form a buffer region 745 between the first drift region 741 and the drain region 746, while the main portion 731 of the LOCOS structure 730 block dopant of shallow implantation (e.g., low-energy implantation) from penetrating through. The example device 700 can further includes a 'substrate surface extension' 749 (or a layer surface extension). The substrate surface extension 749 is defined as a portion of the substrate surface (or the layer surface) between the LOCOS structure 730 and the drain region 746 that is not covered by any portion of the LOCOS structure 730. The substrate surface extension 749 (and the respective preserved tapered portion 732) can allow dopants of shallow implantation (e.g., low-energy implantation) to penetrate therethrough to form the buffer region 745 between the first drift region 741 and the drain region 748. The tapered portion 732 has gradually reduced thickness in the direction from the LOCOS structure 730 (or from the first drift region 741 under the main portion 731 of the LOCOS structure 730) towards the drain region 746, and accordingly the dopant concentration of the respective buffer region 745 increases gradually and smoothly (see, e.g., the ellipse region of FIG. 6) in the direction from the LOCOS structure 730 (or from the first drift region 741 under the main portion 731 of the LOCOS structure 730) towards the drain region 746.

The LOCOS structure 730 is on, over, or partially in semiconductor layer 720. The LOCOS structure 730 (e.g., field-relief LOCOS structure) extends along the second surface 722 of the semiconductor layer 720 and along the in-plane direction (X-axis) to provide a field gap for the extended drain region 746. The drain region 746 is extended or arranged away from the channel region 751 by relatively lightly doped first drift region 741 and the drift transition region 742 and the buffer region 745. A material of the LOCOS structure 730 may include silicon oxide. In some examples, a thickness of the main portion 731 of the LOCOS structure 730 along the out-of-plane direction is in a range of 30 nm to 400 nm. For example, for a lower-voltage LDMOS or drain extended transistor device (e.g., 5V to 40V), a thickness of the main portion 731 of the LOCOS structure 730 along the out-of-plane direction is in a range of 30 nm to 200 nm; and for a higher-voltage LDMOS or drain extended transistor device (e.g., 40 to 120V), a thickness of the main portion 731 of the LOCOS structure 730 is in a range of 200 nm to 400 nm. The LOCOS structure 730 is on or over the first drift region 741 and between the drain region 746 and the channel region 751.

In some examples, the LOCOS-to-LOCOS distance D-7LL (i.e., the distance between main portions 731 of LOCOS structures 730) of the LOCOS structure 730 has a value in a range of 300 nm to 1400 nm; and the width D746 of the drain region 746 has a value in a range of 100 to 400 nm. In certain examples, the distance D71 between the main portion 731 of the LOCOS structure 730 and the edge E71 of the silicide contact 748 has a value in a range of 100 to 500 nm.

The first drift region 741 has a lower dopant concentration than the buffer region 745. The first drift region 741 or a portion of first drift region 741 extends between the drift transition region 742 and the buffer region 745. In the examples of FIG. 7, the first drift region 741 is at an N dopant concentration; and the drift transition region 742 and the buffer region 745 have N+ dopant concentrations.

Along the in-plane direction (X-axis), the buffer region 745 extends laterally between the drain region 746 and at least a portion of the first drift region 741 that is under the LOCOS structure 730. The buffer region 745 is in contact with and under the tapered portion 732 of the LOCOS structure 730 and in contact with the drain region 746. For example, the buffer region 745 is adjacent to or under the tapered portion 732 of the LOCOS structure 730 along the out-of-plane direction (Z axis). In some examples, a lateral width of the buffer region 745 along the in-plane direction (e.g., X-axis) is in a range of approximately 100 nm to 500 nm. In certain examples, a lateral width of the tapered portion 732 between the main portion 731 and the drain region 746 along the in-plane direction (e.g., X-axis) is in a range of approximately 20 nm to 500 nm.

The buffer region 745 is in contact with the drain region 746, the first drift region 741, the tapered portion 732 of the LOCOS structure 730, and the substrate surface extension 749. The buffer region 745 is between the first drift region 741 (or a portion of first drift region 741) and the drain region 746 along the in-plane direction (X-axis). The buffer region 745 or a portion of the buffer region 745 is at a location under the tapered portion 732 of the LOCOS structure 730, e.g., at a location that has same X and Y values, but a different Z value as compared to the tapered portion 732 of the LOCOS structure 730.

In the examples of FIG. 7, the buffer region 745 and the drift transition region 742 have N+ dopant concentrations; and the first drift region 741 has an N dopant concentration; and the drain region 746 has an N++ dopant concentration; and the semiconductor region 725 has a P− dopant concentration. A dopant concentration of the buffer region 745 is greater than a dopant concentration of the first drift region 741 and less than a dopant concentration of the drain region 745. In some examples, the dopant concentration of the buffer region 745 is approximately 2 to 10 times higher than the dopant concentration of the first drift region 741.

Via the combination of the drift region (such as first drift region 741) and the semiconductor region 725, reduced-surface-field (RESURF) effect of the drift region can be achieved. In some examples, in response to a reverse bias being provided to the p-n junction of the n-type drift region (such as first drift region 741) and the p-type semiconductor region 725, the n-type first drift region 741, such as the portion of the n-type first drift region 741 under the LOCOS structure 730, is depleted, so as to achieve RESURF effect of the first drift region 741 of the semiconductor device 700.

The dose (e.g., dopants per area) of the doping region in first drift region 741 may be chosen to satisfy a reduced-surface-field (RESURF) condition, which may provide depletion of the first drift region 741, e.g., in the off-state (gate voltage=0 volts). The buffer region 745 near the drain region 746 and operating as a second drift region increases the dose beyond the RESURF condition, so that in the off-state (gate voltage=0 volts), impact ionization occurs when the depletion edge of the first drift region 741 meets the buffer region 745, initiating device breakdown.

As the drain voltage is increased beyond breakdown, an excess concentration of electrons and holes builds up in the first drift region 741 due to impact ionization, pushing the depletion edge of the first drift region 741 closer to the drain region 746. The doping of the drain region 746 is high enough, and when the depletion edge of the first drift region 741 reaches the drain region 746, the electric field in the first drift region 741 increases dramatically and avalanche ensues, which can cause device destruction. By including the buffer region 745, a finite region of voltage where impact ionization can occur without immediate device failure is provided between the initiation of breakdown and catastrophic failure of the semiconductor device 700. Such capability is called ruggedness, and it results in the ability of the semiconductor device 700, such as a power transistor, to survive fault conditions such as hot switching or inductor load dump that may occur in, e.g., power electronic systems.

The body region 750 is in the semiconductor layer 720, and includes the channel region (or a portion of the channel region) 751, e.g., laterally, adjacent to the drift transition region 742 along the in-plane direction (X-axis). The channel region 751 further extends into and includes a portion 726 of semiconductor region 725 between the body region 750 and the drift transition region 742 and adjacent to the gate structure 760. The source regions 756, the drain region 746, and the body contact region 755 are in the semiconductor layer 720. The source region 756 is laterally adjacent to the channel region 751 along the in-plane direction (X-axis). The body contact region 755 is laterally adjacent to the source region 756 along the in-plane direction (X-axis), and provides an electrical connection to the body region 750.

In the example of FIG. 7, the body region 750 having a P dopant concentration serves as a body region. In other examples, the semiconductor region 725 can extend to the regions of the body regions 750 to serve or operate as body regions, without the need to have the region 750. The channel region 751 is between the source region 756 and the drift region (including the first drift region 741, the drift transition region 742, and the buffer region 745). The channel region 751 extends along the in-plane direction (X-axis). The source region 756, the body region 750, the buffer region 745, and the drain region 746 extend from the second surface 722 towards the first surface 721 of the semiconductor layer 720.

The gate structure 760 is on or over the channel region 751 of the body region 750, and includes a gate dielectric layer 761 and a gate electrode 762 on the gate dielectric layer 761. The gate dielectric layer 761 extends over the channel region 751, and extends over the drift transition region 742, and a portion of the LOCOS structure 730. The gate electrode 762 has a portion that extends beyond the channel region 751, and towards the first drift region 741, and that portion of the gate electrode 762 may be or serve as a field plate, to control distribution of field lines, to shape electrostatic fields in the first drift regions 741, and to increase break-down voltage of the semiconductor device 700. In the example of FIG. 7, the field plate is an integral part of the gate electrode 762. In other examples, the field plate is a separate part with respect to the gate electrode, and is electrically coupled to a terminal, such as the gate electrode.

In some examples, a material of the gate electrode 762 includes polysilicon and/or any other suitable material. In some examples, a material of the gate dielectric layer 761 includes silicon oxide and/or any other suitable dielectric material.

The sidewall spacers 765 are along or at lateral sides of the gate electrode 762. The sidewall spacer 765 may include silicon dioxide, silicon nitride, multiple layers of silicon dioxide and silicon nitride, and/or any other suitable insulating layers. The SiBLK layers 770 are on or over the LOCOS structures 730 and the substrate surface extension 749. The SiBLK layer 770 extends over and covers the exposed portion of the LOCOS structure 730, where the exposed portion of the LOCOS structure 730 is exposed from the gate structure 760 and sidewall spacer 765. The SiBLK layer 770 extends partially over the gate electrode 762.

The SiBLK layer 770 includes a material that protects, e.g. prevents silicide formation on, the LOCOS structure 730 and the buffer region 745. In some examples, the SiBLK layer 770 includes an oxide material and/or a nitride material that blocks silicide formation. In certain examples, the SiBLK layer 770 includes a silicide block material that mitigates or prevents silicidation of the LOCOS structure 730 and the buffer region 745 during deglazing and other operations during and after silicide contact formation when fabricating the semiconductor device.

In the example of FIG. 7, the first drift region 741 has an N dopant concentration; the buffer region 745 has an N+ dopant concentration; the drain region 746 has an N++ dopant concentration; the body region 750 has a P dopant concentration; the body contact region 755 has a P++ dopant concentration; the source region 756 has an N++ dopant concentration; and regions 741, 745, 746, 756, are n-type doped or have n-type conductivity, and regions 750, 725 are p-type doped or have p-type conductivity. In other examples, various dopant concentrations and different doping types may be chosen for components (such as 725, 741, 742, 745, 746) of the semiconductor device 700 according to application scenarios.

Referring to FIG. 8, the drain region 746 extends along the in-plane direction (Y-axis). The substrate surface extensions 749 extend along the in-plane direction (Y-axis) and further extend in curved shapes to form an integrated member that laterally encircles the drain region 746 in X-Y plane; and the buffer region 745 (not shown in FIG. 8) can, in a same or similar way, extend along the in-plane direction (Y-axis) and further extend in curved shapes to form an integrated region that laterally encircles the drain region 746 in X-Y plane. The LOCOS structures 730 extend along the in-plane direction (Y-axis) and further extend in curved shapes to form an integrated LOCOS structure that laterally encircles the drain region 746 and the substrate surface extensions 749 in X-Y plane.

Various arrangements such as lateral relationships may be chosen for the components of the semiconductor device 700 according to application scenarios. As another example, the buffer regions 745 of the semiconductor device 700 are two elongated stripe-shaped regions extending along the in-plane direction (Y-axis) on two sides of the drain region 746; and the LOCOS structures 730 of the semiconductor device 700 are two elongated stripe-shaped structures extending along the in-plane direction (Y-axis) on two sides of the drain region 746.

Figure 9:
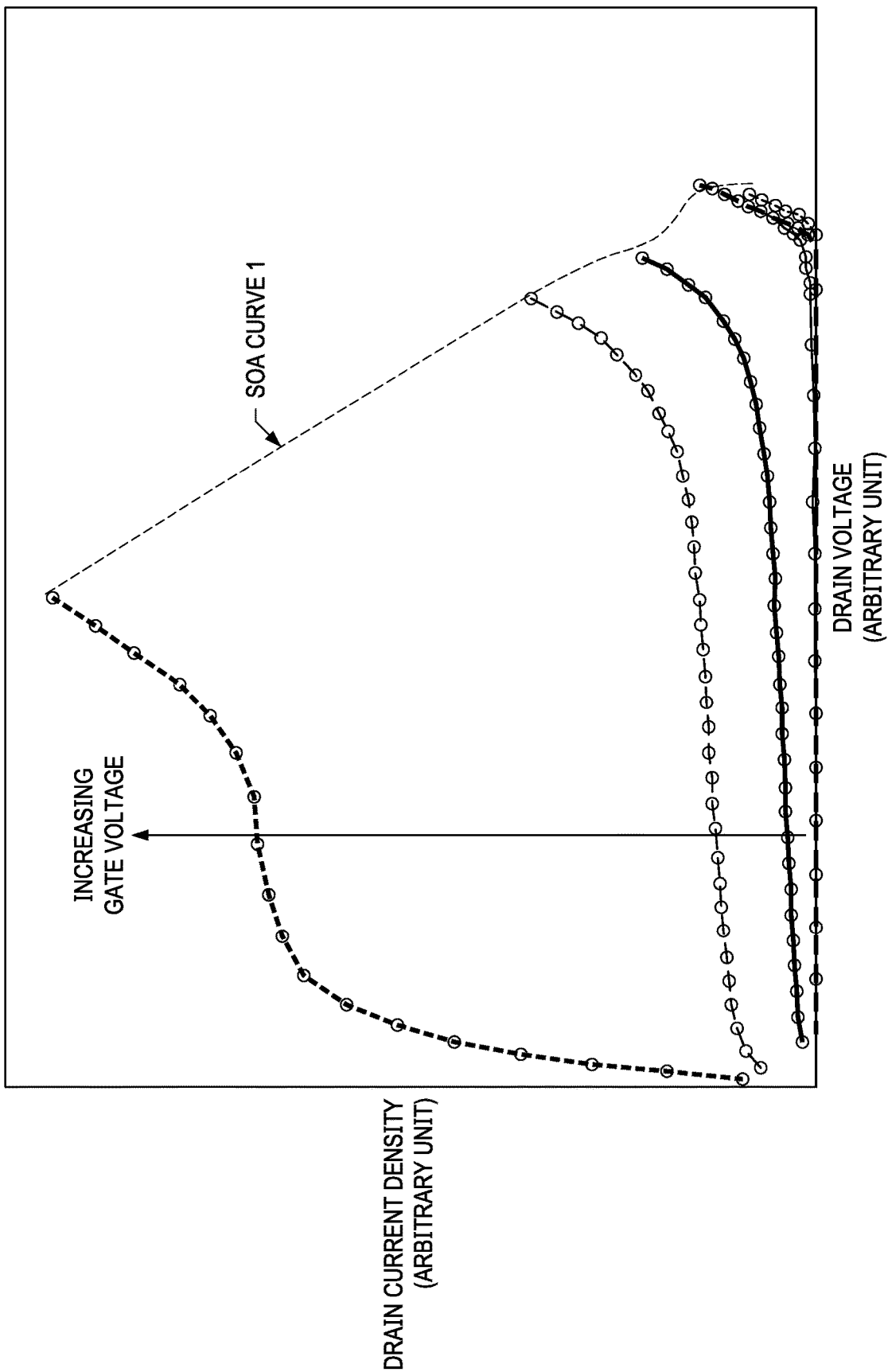
FIG. 9 illustrates current-voltage characteristic of a baseline semiconductor device.
Figure 10:
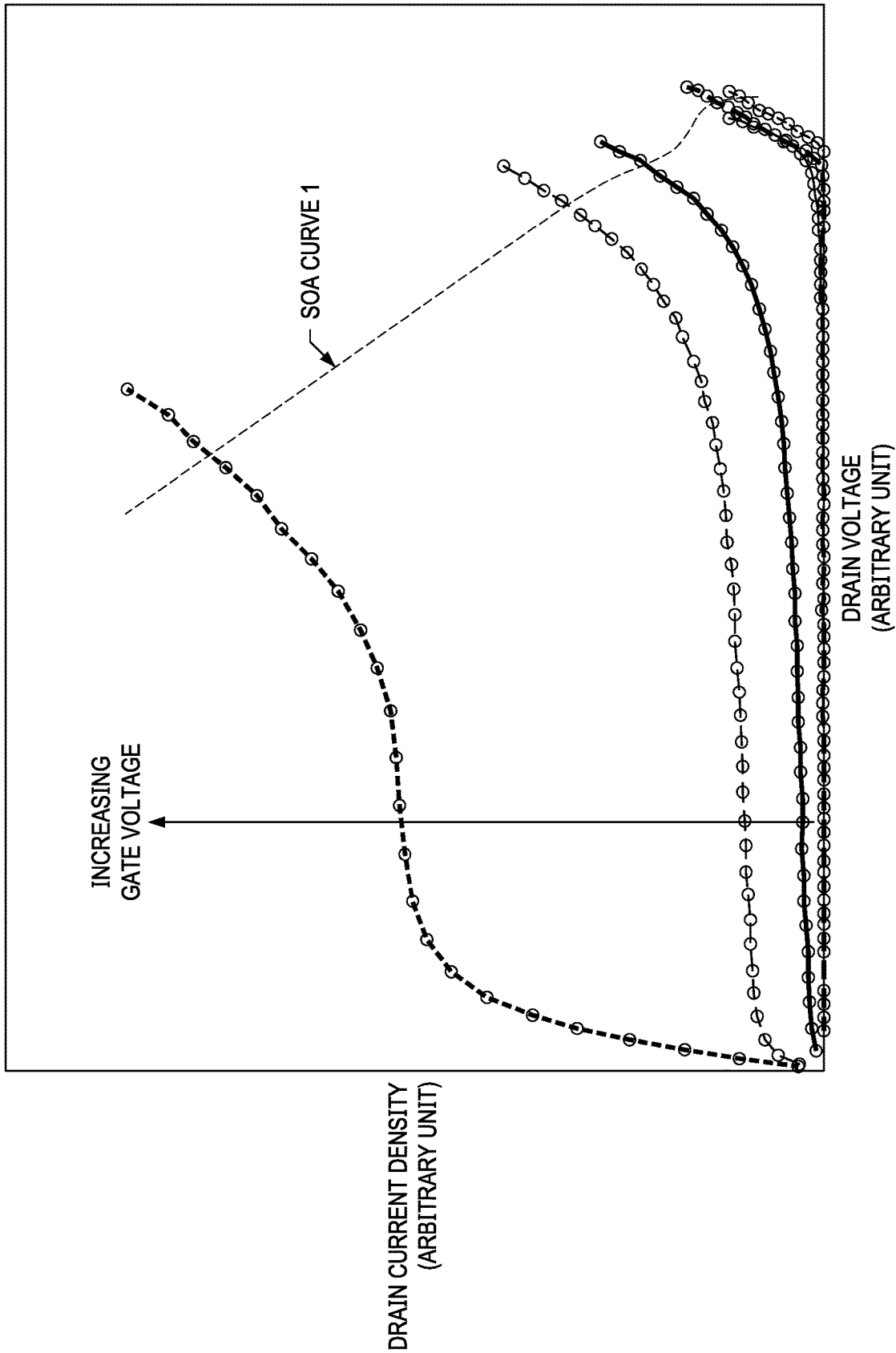
FIG. 10 illustrates current-voltage characteristic of an example semiconductor device.

FIG. 9 illustrates current-voltage characteristic of a baseline semiconductor device (such as device 100); and FIG. 10 illustrates current-voltage characteristic of an example semiconductor device (such as device 200, 400, 700). The SOA curve 1 of the baseline semiconductor device of FIG. 9 is a failure boundary of the baseline semiconductor device of FIG. 9. The SOA curve 1 (i.e., the failure boundary of the baseline semiconductor device of FIG. 9) is overlaid in FIG. 10. Current-voltage curves of the example semiconductor device in FIG. 10 extend beyond the SOA curve 1. Accordingly, the SOA is wider in the example semiconductor device of FIG. 10, as compared to the SOA of the baseline semiconductor device of FIG. 9. Adding or having a buffer region (e.g., 745 in FIG. 7) surrounding the n++ drain region (e.g., 746 in FIG. 7) can improve power transistor SOA. It works through the Kirk effect, in which the depletion edge moves into the more heavily doped silicon region under conditions of high injection, which happens as drain current increases. This has the effect of increasing device breakdown voltage as gate voltage and drain current increase. Such a device is known as rugged, since it is better able to survive breakdown (at least momentarily until damage from other mechanisms accumulates) than a non-rugged power transistor. Power transistor SOA is a quantitative measurement of ruggedness, and the wider SOA in the example semiconductor device of FIG. 10 indicates improved ruggedness, as compared to the baseline semiconductor device corresponding to FIG. 9.

Figure 11:
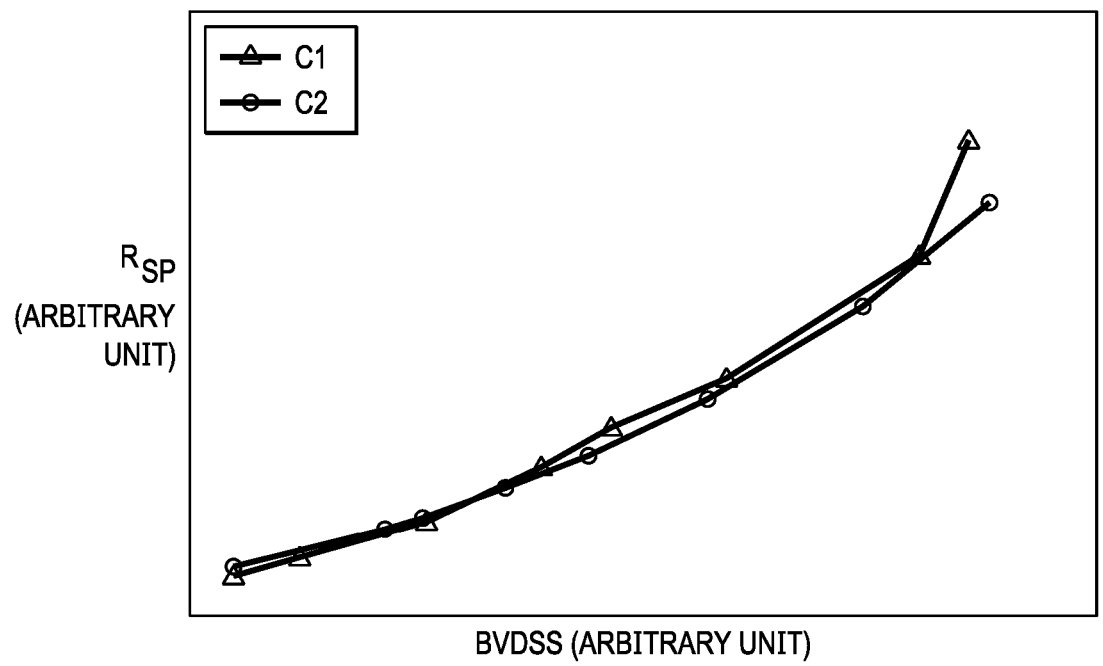
FIG. 11 illustrates specific on-resistance of an example semiconductor device in comparison with baseline semiconductor devices.

FIG. 11 illustrates specific on-resistance of an example semiconductor device (such as device 200, 400, 700) in comparison with baseline semiconductor device, where Rsp is specific on-resistance, BVDSS is drain-to-source breakdown voltage. Rsp Curve C2 of the example semiconductor device (such as device 200, 400, 700) consistent with the present disclosure has preserved or even reduced specific on-resistance as compared to Rsp curve C1 of baseline semiconductor device.

Figure 12:
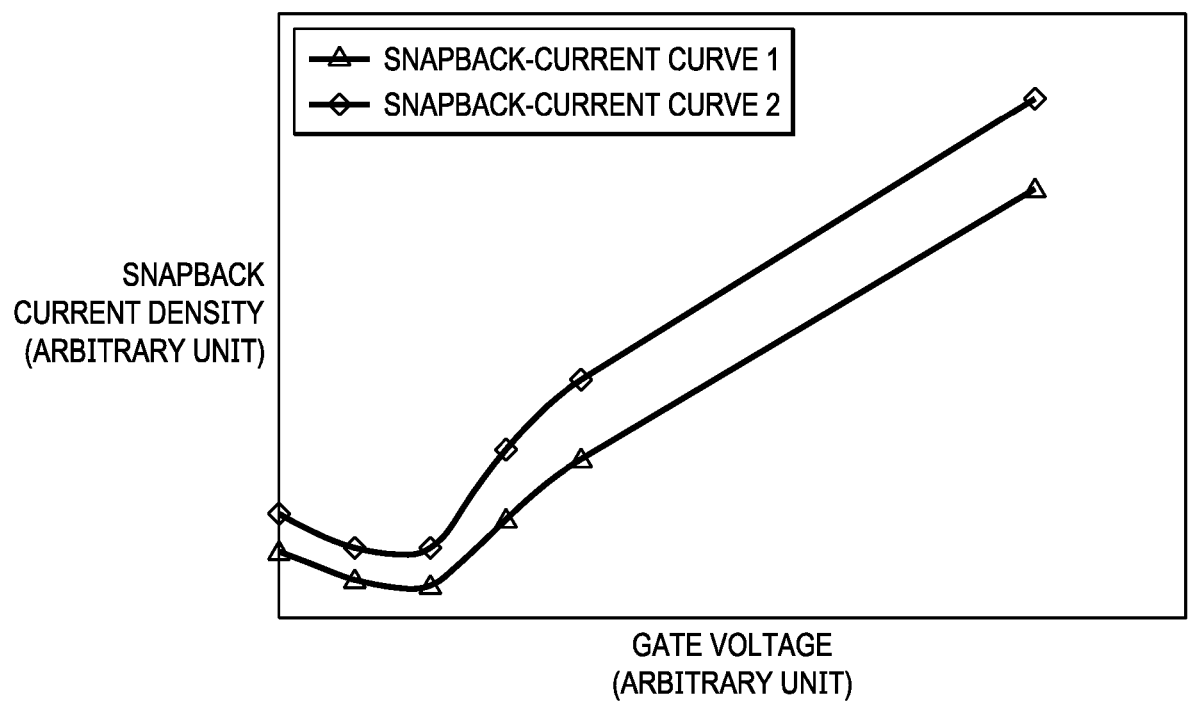
FIG. 12 illustrates snapback current-voltage characteristic of an example semiconductor device in comparison with a baseline semiconductor device.

FIG. 12 illustrates snapback current-voltage characteristic of an example semiconductor device (such as device 200, 400, 700) in comparison with a baseline semiconductor device (such as device 100). Snapback current density in the snapback-current curve 2 of example semiconductor device of the present disclosure are increased and improved, as compared to snapback current density in the snapback-current curve 1 of the baseline semiconductor device (such as device 100). Accordingly, snapback current density is increased and improved in the semiconductor devices consistent with the present disclosure. Since a power transistor current-voltage I(V) curve begins to resemble a resistor I(V) curve (i.e. sloping up and to the right in the I(V) plot), a wider SOA snapback region goes hand-in-hand with higher snapback current. So higher snapback current is a hallmark of a power transistor with better ruggedness.

In the present disclosure, by increasing the distance between the LOCOS structure and an edge of the silicide contact, a tapered portion is preserved between the main portion of the LOCOS structure and the drain region, and the preserved tapered portion can serve as a screening oxide portion to allow dopants of shallow implantation (e.g., low-energy implantation) to penetrate therethrough to form a smooth doping-concentration transition from the first drift region to the heavily doped drain region of the device. Accordingly, ruggedness can be improved due to Kirk effect, and safe-operating-area can be improved, while specific on-resistance (Rsp) can be preserved or lowered due to that the dopant concentrations of the buffer region is greater than the dopant concentrations of the first drift region.

FIGS. 13 to 22 and 7 illustrate cross-sectional views of example structures of various stages of the formation of the example semiconductor device 700, and accordingly illustrate an example method of forming the semiconductor device 700.

FIG. 13 illustrates forming a silicon-nitride hard mask on or over a semiconductor layer 720 (e.g., a semiconductor substrate). The patterned silicon-nitride hard mask M0 is on or over the semiconductor layer 720 and has one or more openings to expose one or more portions of the second surface 722 of the semiconductor layer 720 for local oxidation. The patterned silicon-nitride hard mask M0 can be formed by depositing a silicon-nitride film and performing a nitride etch to one or more portions of the silicon-nitride film with a patterned photoresist mask.

FIG. 14 illustrates forming LOCOS structures 730 by performing local-oxidation-of-silicon (LOCOS) process. The LOCOS structures 331 are formed on or over the portion of silicon surface of the semiconductor layer 720 exposed by the patterned mask M0, and on or over the prospective first drift region (741 in FIG. 7). The main portions 731 of one or more respective LOCOS structures 730 of FIG. 7B each correspond to a respective opening of patterned mask M0 used during the LOCOS process. For example, the width D731 of main portion 731 along X axis corresponds to or is equal to the width E0 of respective opening of patterned mask M0. Further, during the LOCOS process, oxygen can (or is caused to) diffuse between the underlying semiconductor layer and the overlying mask M0 and beyond the width E0 of respective opening of patterned mask M0, and accordingly the tapered portions 732 (i.e., bird's beak) are formed and extend beyond the width E0 of respective opening of patterned mask M0. After the LOCOS structures 331 are formed, the patterned mask M1 can be removed.

Figure 15:
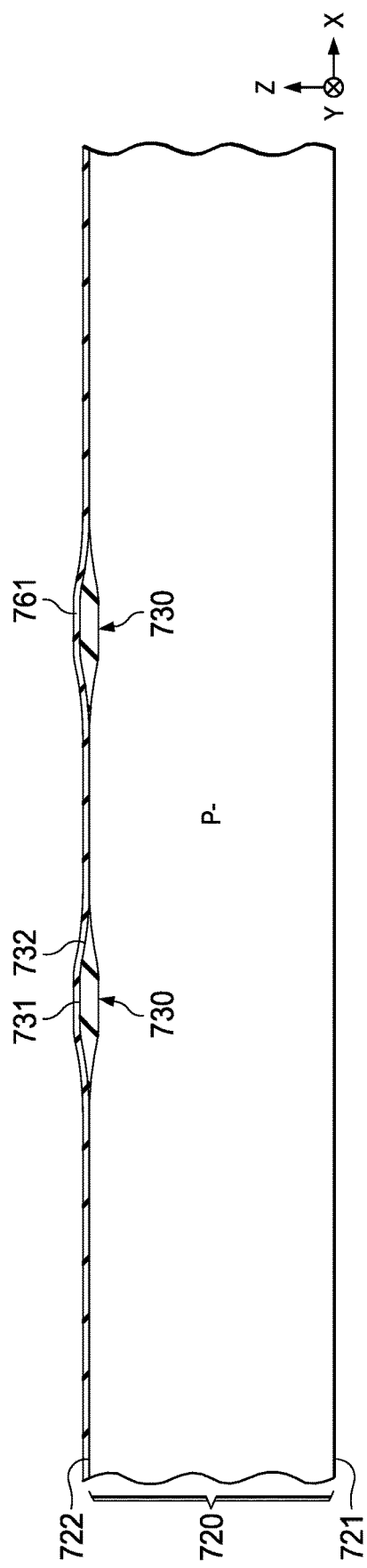

FIG. 15 illustrates depositing dielectric materials to form a gate dielectric layer 761 over or on semiconductor layer 720 and LOCOS structures 730. The gate dielectric layer 761 can be further etched to have suitable sizes and shapes. In some examples, a material of the gate dielectric layer 761 includes silicon oxide and/or any other suitable dielectric material.

Figure 16:
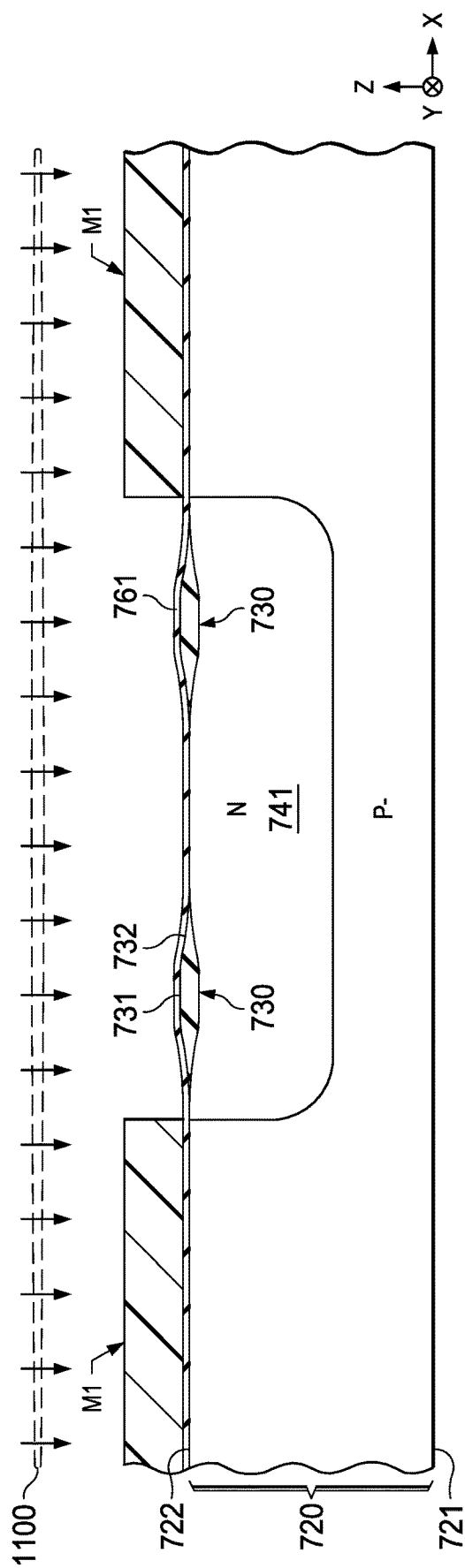

FIG. 16 illustrates forming a first drift region with a mask and by ion implantation. The first drift region 741 may be formed by a first ion implantation 1100 (e.g., a deep implantation) at a first implantation energy with a patterned photoresist mask M1 that defines the exposed implantation region of the first ion implantation 1100. In the example of FIG. 16, the first drift region 741 have a dopant concentration of N. In some examples, the first ion implantation has a dose, e.g., a total dose, that approximately equals a RESURF condition of 2 to $4\times10^{12}$ cm$^{-2}$, such that the drift region (such as first drift region 741) may be depleted, e.g., in the off-state (gate voltage=0 volts), and increased breakdown voltage of the semiconductor device 700 may be achieved.

FIG. 17 illustrates forming drift transition regions and buffer regions with a mask and by an ion implantation. The drift transition regions 742 and buffer regions 745 can be formed by a second ion implantation 1200 (e.g., a shallow implantation) at a second implantation energy with the same patterned photoresist mask M1 as the first ion implantation 1100 (e.g., a deep implantation) without having to use an additional mask, so as to simplify fabrication procedure and reduce fabrication cost. Because the tapered portions 732 can serve as a screening oxide portion to allow dopants of shallow implantation (e.g., low-energy implantation) to penetrate therethrough, the buffer regions 745 can be formed by using the same second ion implantation 1200 as the drift transition regions 742 and by using the same patterned photoresist mask M1 as the first ion implantation 1100 (for forming the first drift region 741), with no additional photoresist mask or implantation, and accordingly, fabrication cost can be reduced. The second implantation energy of the second ion implantation 1200 is lower than the first implantation energy of the first ion implantation 1100, and the second ion implantation 1200 has a shallower implantation depth than the first ion implantation 1100. Accordingly, depths of the drift transition regions 742 and buffer regions 745 are less than a depth of first drift region 741. In some examples, the second ion implantation 1200 is performed after the first ion implantation 1100. In other examples, the second ion implantation 1200 is performed before the first ion implantation 1100.

Parameters such as implantation energies, doses, and dopants of the first ion implantation 1100 can be chosen according to various application scenarios, and the first ion implantation 1100 may include various deep implantations with various or different parameters. For example, the first ion implantation 1100 can include a deep implantation with phosphorus dopants and another deep implantation with arsenic dopants. Parameters such as implantation energies, doses, and dopants of the second ion implantation 1200 can be chosen according to various application scenarios, and the second ion implantation 1200 may include various shallow implantations with various or different parameters. For example, the second ion implantation 1200 can include a shallow implantation with phosphorus dopants and another shallow implantation with arsenic dopants.

The second implantation energy of the second ion implantation 1200 can be chosen such that the main portion 731 of the LOCOS structure 730 can block dopants of the second implantation 1200, but the tapered portions 732 can allow dopants of the second implantation 1200 to penetrate therethrough. In some examples, the main portion 731 of the LOCOS structure 730 has a thickness of 30 nm to 200 nm, and the second implantation energy of the second ion implantation 1200 (shallow implantation) is less than 50 keV for phosphorus dopants, and is less than 100 keV for arsenic dopants, and is less than 200 KeV for antimony dopants. The second implantation energy can be chosen according to the chosen thickness of the main portion 731 of the LOCOS structure 730. For example, with a larger thickness of the main portion 731 of the LOCOS structure 730, the second implantation energy can be increased.

At this step of FIG. 17, a doped region 743 at an N+ dopant concentration is formed, which includes the buffer regions 745 and a region corresponding to the prospective drain region (FIG. 7). The dopant concentration of the region corresponding to the prospective drain region can be further increased to an N++ dopant concentration at another step. The mask M1 covers prospective source and body regions, exposes portions corresponding to the drift transition regions 742, LOCOS structures 730, and the doped region 743. During ion implantations 1100, due to the relatively higher implantation energy, the dopants can penetrate LOCOS structures 730, and the first drift region 741 can be formed in the exposed portions defined by the mask M1. During the second ion implantation 1200, due to the relatively lower implantation energy, dopants are blocked by and cannot penetrate the main portions 731 of the LOCOS structures 730. However, the preserved tapered portions 732 (serving as a screening oxide portion) and the substrate surface extension 749 (see FIG. 7) can allow dopants of lower-energy implantation 1200 to penetrate therethrough to form buffer regions 745 having a smooth doping-concentration transition. In the example of FIG. 17, the drift transition regions 742 and buffer regions 745 have dopant concentrations of N+. The patterned photoresist mask M1 can be removed after use.

FIG. 18 illustrates forming body regions in the semiconductor layer. The body regions 750 are buried in the semiconductor layer 720. In the examples of FIG. 18, the body regions 750 are formed by an implantation 1300 with a patterned photoresist mask M2 to implant p-type dopants into the semiconductor layer 720; and the body regions 750 have a dopant concentration of P. The photoresist mask M2 can be removed after use.

FIG. 19 illustrates depositing materials to form a gate electrode 762 over or on the gate dielectric layer 761. The gate electrode 762 can be further etched to have suitable sizes and shapes. A patterned mask M3 can be formed on or over the gate electrode 762 for defining the sizes and shapes of the gate electrode 762 and the gate dielectric layer 761.

FIG. 20 illustrates etching away one or more portions of the gate electrode 762 and the gate dielectric layer 761 with the patterned photoresist mask M3, such that the gate electrode 762 and the gate dielectric layer 761 have suitable sizes and shapes. Portions of the gate electrode 762 and the gate dielectric layer 761 being exposed by the patterned mask M3 are etched away, and accordingly suitable sizes and shapes of the gate electrode 762 and the gate dielectric layer 761 are obtained. The patterned photoresist mask M3 can be removed after use. In some examples, the material of the gate electrode 762 includes polysilicon and/or any other suitable material. In some examples, a material of the gate dielectric layer 761 includes silicon oxide and/or any other suitable dielectric material.

Figure 21:
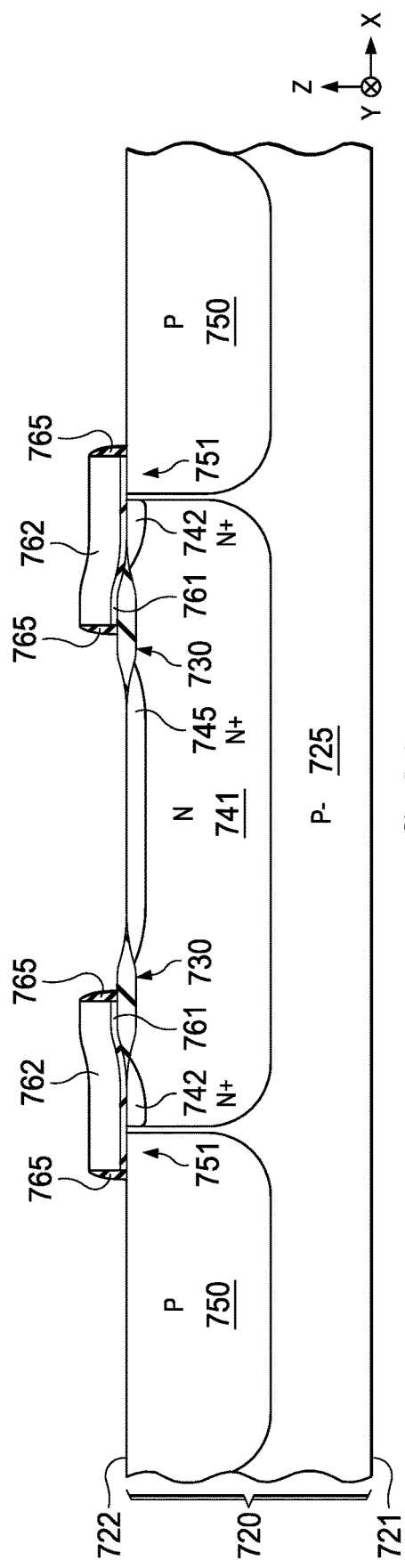

FIG. 21 illustrates forming sidewall spacers 765 along or at lateral sides of the gate electrode 762 and the gate dielectric layer 761. The sidewall spacer 765 may be formed by depositing a thin film over the gate electrode 762 and removing a certain thickness of the thin film. The sidewall spacer 765 may include silicon dioxide, silicon nitride, multiple layers of silicon dioxide and silicon nitride, and/or any other suitable insulating layers, so as to protect, e.g., electrically sensitive channel region 751 and the gate electrode 762.

Figure 22:
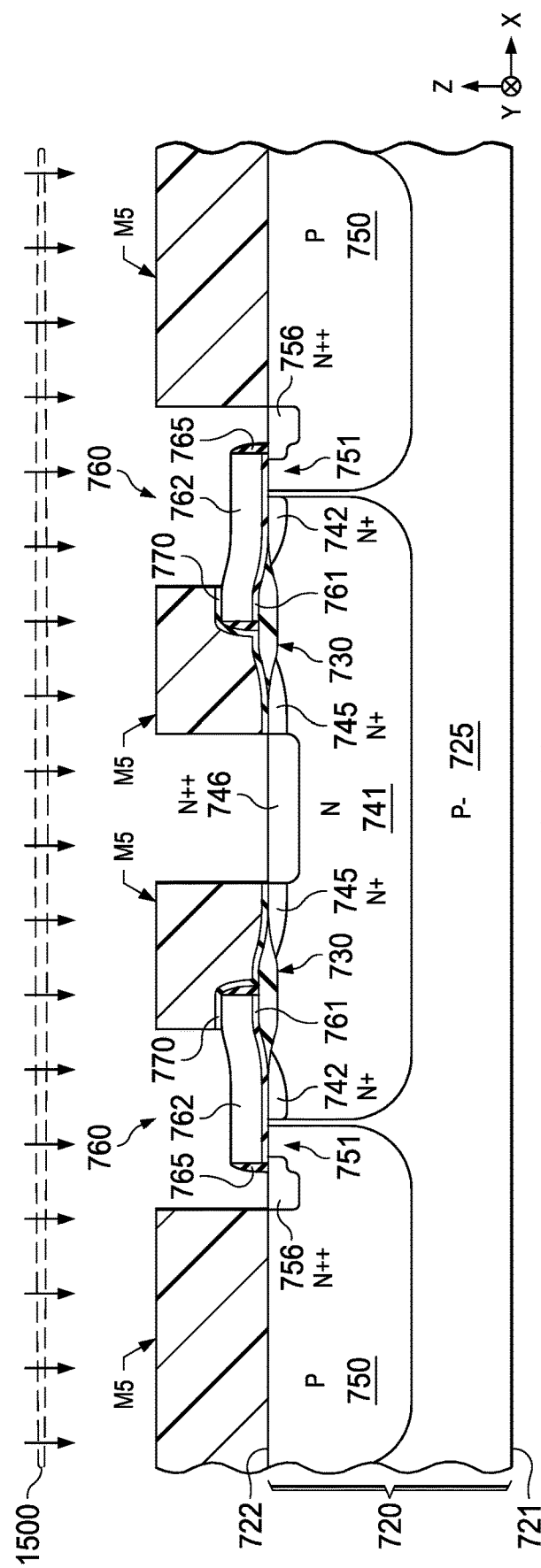

FIG. 22 illustrates forming SiBLK layers 770 and forming source regions 756 and drain region 746. The SiBLK layer 770 extends over the exposed portion of the LOCOS structure 730 and the buffer region 745, where the exposed portion of the LOCOS structure 730 is exposed from the gate structure 760 and sidewall spacer 765. The SiBLK layer 770 extends partially over the gate electrode 762. The source regions 756 and drain region 746 are formed by implantation with a patterned photoresist mask M5. Accordingly, source regions 756 with N++ dopant concentration are formed; and the drain region 746 with N++ dopant concentration is formed laterally (e.g., along X-axis) adjacent to and in contact with the buffer regions 745.

Referring back to FIG. 7, body contact regions 755 are formed in contact with the body regions 750, and a silicide contact 748 is formed on or over the drain region 746, and tungsten contacts 747 are formed on or over the silicide contact 748. The body contact regions 755 may be formed by dopant implantation with a patterned photoresist mask, and can have a P++ dopant concentration. Photoresist masks are used in the fabrication process and can be removed after their uses. In some examples, the silicide contact 748 can be formed on or over the drain region 746 by silicidation of silicon of the drain region 746.

In the example of FIG. 15, dielectric materials are deposited to form the gate dielectric layer 761 on or over semiconductor layer 720 and LOCOS structures 730, which may be performed before forming the first drift region 741, the drift transition regions 742, and buffer regions 745, and the body regions 750. In other examples, dielectric materials can be thermally grown by oxidation of silicon at the second surface 722 (or a portion of the second surface 722) of the semiconductor layer 720 to form the respective gate dielectric layer, which can be performed after forming the first drift region 741, the drift transition regions 742, buffer regions 745, and the body regions 750.

Modifications, additions, or omissions may be made to the systems, devices, and methods described herein without departing from the scope of the disclosure. Moreover, the operations of the systems and devices disclosed herein may be performed by including more, fewer, or other components; and the methods described may include more, fewer, or other steps. Additionally, steps may be performed in any suitable order.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A semiconductor device, comprising:
a source region in a semiconductor substrate;
a drain region having a first conductivity type and a first dopant concentration spaced apart from the source region;
a first drift region located between the source region and the drain region and having the first conductivity type and a second dopant concentration that is lower than the first dopant concentration of the drain region;
a channel region having a different second conductivity type between the source region and the first drift region;
an oxide structure between the channel region and the drain region and including a first portion on or over the first drift region and a tapered portion between the first portion and the drain region;
a substrate surface extension between the tapered portion and the drain region;
a gate structure on or over the oxide structure and including a portion over the channel region; and
a buffer region having the first conductivity type between the first drift region and the drain region and under the tapered portion of the oxide structure, the buffer region having a third dopant concentration between the second dopant concentration of the drain region and the first dopant concentration of the first drift region.

2. The semiconductor device of claim 1, wherein the tapered portion has a thickness that decreases from a thickness of the first portion to zero towards the drain region.

3. The semiconductor device of claim 1, wherein the buffer region has a dopant concentration no greater than ten times a dopant concentration of the drift region.

4. The semiconductor device of claim 1, wherein the buffer region has a dopant concentration that increases from a first dopant concentration of the drift region to a second dopant concentration that remains about constant over a distance of at least 100 nm.

5. The semiconductor device of claim 1, wherein:
the oxide structure is a local-oxidation-of-silicon (LOCOS) structure.

6. The semiconductor device of claim 1, wherein the buffer region has a dopant concentration that increases at least 50% and no more than 400% over a distance of 300 nm.

7. The semiconductor device of claim 1, further comprising:
a SiBLK layer on or over the oxide structure and the buffer region.

8. The semiconductor device of claim 7, wherein the SiBLK layer includes silicon oxide.

9. The semiconductor device of claim 1, wherein the buffer region touches the substrate surface extension.

10. The semiconductor device of claim 1, wherein the first conductivity type is n-type and the second conductivity type is p-type.

11. The semiconductor device of claim 1, wherein the third dopant concentration of the buffer region is approximately 2 to 10 times higher than the first dopant concentration of the first drift region.

12. A semiconductor device, comprising:
an n-type source region in a semiconductor substrate;
an n-type drain region having a first dopant concentration spaced apart from the source region;
an n-type drift region located between the source region and the drain region and having a second dopant concentration that is lower than the first dopant concentration;

a p-type channel region between the source region and the drift region;

a LOCOS structure between the channel region and the drain region including a first portion on or over the drift region and a tapered portion between the first portion and the drain region;

a substrate surface extension between the tapered portion and the n-type drain region;

a gate structure on or over the LOCOS structure and including a portion over the channel region; and a buffer region between the drift region and the drain region and under the tapered portion of the LOCOS structure, the buffer region having a dopant concentration that increases no more than 10×from the drift region towards the drain region.

13. The semiconductor device of claim 12, wherein the dopant concentration of the buffer region increases by at least 50% and no more than 400%.

14. The semiconductor device of claim 12, wherein a thickness of the tapered portion decreases to zero between the drift region to the drain region.

15. An integrated circuit, comprising:

a source region and a drain region having a first conductivity type extending into a semiconductor substrate, the drain region having a first dopant concentration;

a channel region having an opposite second conductivity type between the source region and the drain region;

a drift region having the first conductivity type extending between the channel region and the drain region, the drift region having a second dopant concentration less than the first dopant concentration;

a LOCOS structure over the drift region and having a tapered portion extending toward the drain region; and a buffer region having the first conductivity type under the tapered portion, the buffer region having a third dopant concentration less than the first dopant concentration and greater than the second dopant concentration.

16. The integrated circuit of claim 15, wherein the buffer region has a width, parallel to a top surface of semiconductor substrate, of at least 100 nm.

17. The integrated circuit of claim 15, wherein the buffer region has about a constant dopant concentration over a width, parallel to a top surface of semiconductor substrate, of at least 50 nm.

18. The integrated circuit of claim 15, wherein the dopant includes phosphorous.

19. The integrated circuit of claim 15, wherein the third dopant concentration is about two times the second dopant concentration.

20. The integrated circuit of claim 15, wherein the first conductivity type is n-type and the second conductivity type is p-type.

* * * * *